United States Patent
Gendler et al.

(10) Patent No.: US 9,748,977 B2
(45) Date of Patent: *Aug. 29, 2017

(54) DOUBLE CONSECUTIVE ERROR CORRECTION

(71) Applicant: INTEL CORPORATION, Santa Clara, CA (US)

(72) Inventors: Alexander Gendler, Kiriat Motzkin (IL); Gilad Cohen, Haifa (IL)

(73) Assignee: Intel Corporation, Santa Clara, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 15/355,199

(22) Filed: Nov. 18, 2016

(65) Prior Publication Data
US 2017/0070242 A1     Mar. 9, 2017

Related U.S. Application Data

(63) Continuation of application No. 14/225,972, filed on Mar. 26, 2014, now Pat. No. 9,529,665.

(51) Int. Cl.
| | |
|---|---|
| *H03M 13/00* | (2006.01) |
| *H03M 13/29* | (2006.01) |
| *G06F 11/10* | (2006.01) |
| *H03M 13/13* | (2006.01) |

(52) U.S. Cl.
CPC ..... *H03M 13/2906* (2013.01); *G06F 11/1008* (2013.01); *H03M 13/13* (2013.01); *H03M 13/616* (2013.01)

(58) Field of Classification Search
None
See application file for complete search history.

(56) References Cited

U.S. PATENT DOCUMENTS

| | | | |
|---|---|---|---|
| 7,243,293 B2 | 7/2007 | Chen | |
| 8,069,392 B1 | 11/2011 | Norrie | |
| 8,996,962 B2* | 3/2015 | Zopf | H03M 13/05 714/774 |

* cited by examiner

*Primary Examiner* — Justin R Knapp
(74) *Attorney, Agent, or Firm* — Lowenstein Sandler LLP

(57) ABSTRACT

Described is a processor with a data storage structure operative to store data and a first error correction code that corresponds to the data. The processor further includes circuitry to compare the first and second error correction codes to obtain a comparison result. There are no errors in the data when the comparison result is equal to zero and there is at least one error in the data when the comparison result is not equal to zero. The circuitry corrects a single bit error of the data when the comparison result matches one of the unique combination of bit values of one of the plurality of bit groups in the generator matrix and corrects two consecutive data bits of the data when the comparison result corresponds to a predefined number of values as a result of an exclusive-or (XOR) operation performed on two consecutive bit groups of the generator matrix.

20 Claims, 13 Drawing Sheets

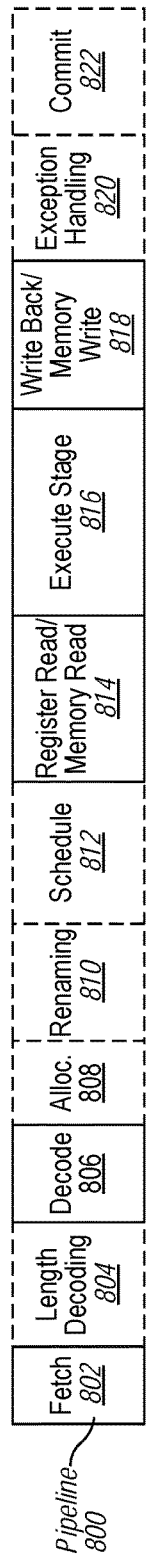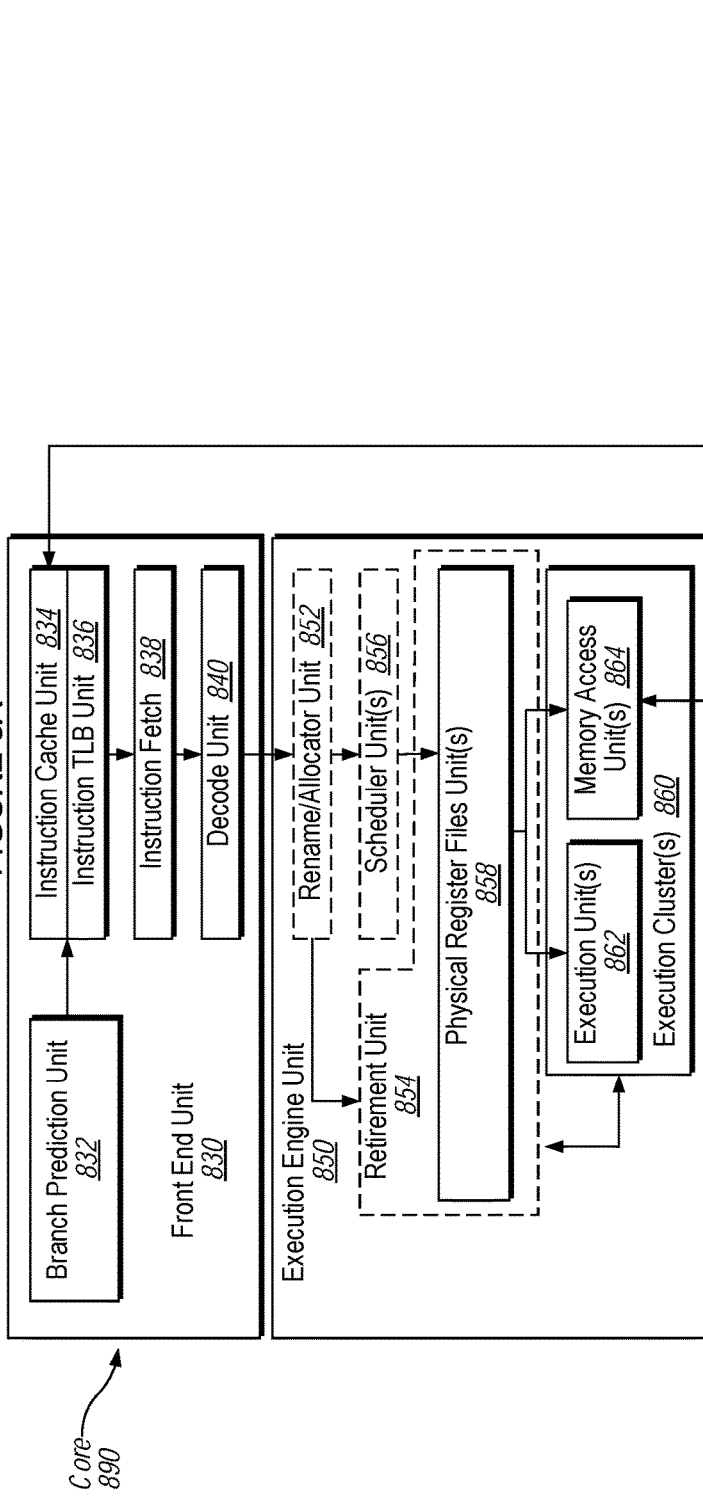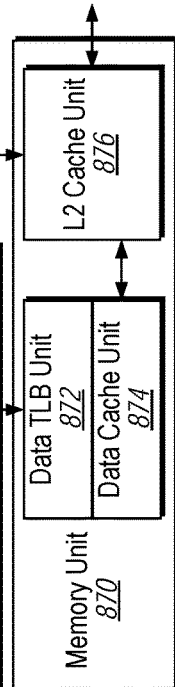

DOUBLE CONSECUTIVE ERROR CORRECTION

RELATED APPLICATIONS

This application is a continuation application of U.S. patent application Ser. No. 14/225,972, filed Mar. 26, 2014, the entire contents of which are hereby incorporated by reference.

TECHNICAL FIELD

The present disclosure generally relates to information processing and, more specifically, relates to error detection and correction in information processing systems.

BACKGROUND

Advancements in manufacturing technologies and materials science provides for greater levels of integration and lower operating voltages in microprocessors, microchips and other data processing apparatuses. As these apparatuses get smaller, the possibility for soft errors often increases. A soft error can arise when an alpha particle or high-energy neutron comes in contact with an integrated circuit, which alters the charges stored on a circuit node. In some instances, the alpha particle or high-energy neutron can change the voltage on the node from a level that represents one logic state to a level that represents a different logic state, in which case the information stored on that node becomes corrupted. Preventing soft errors may be difficult, so data processing apparatuses often include support for detecting, and sometimes correcting, soft errors. For example, storage elements for parity or error-correcting-code (ECC) values may be added to information storage structures.

BRIEF DESCRIPTION OF THE DRAWINGS

The present disclosure is illustrated by way of examples, and not by way of limitation, and may be more fully understood with references to the following detailed description when considered in connection with the figures.

FIG. 8A illustrates elements of a processor micro-architecture according to embodiments.

FIG. 8B illustrates elements of a processor micro-architecture according to embodiments.

DETAILED DESCRIPTION

The present disclosure relates to computer systems, and for detecting and correcting double consecutive errors and single errors. In this description, numerous specific details, such as processor and system configurations, may be set forth in order to provide a more thorough understanding of the present disclosure. It will be appreciated, however, by one skilled in the art, that the techniques described herein may be practiced without such specific details. Additionally, some well-known structures, circuits, and other features have not been shown in detail, to avoid unnecessarily obscuring the present disclosure. For example, a complete description of ECC techniques is not described, as a number of known approaches may be used in embodiments of the present disclosure. In this description, "0" (or "zero") and "1" (or "one") may be used to describe the values of binary digits ("bits") of data or other information, where the former may be any voltage or other level that represents a logical "zero" or "off" value, and the latter may be any such level that represents a logical "one" or "on" value.

In implementations, storage elements may be added to information storage structures to provide for error detection and/or correction in information processing systems. The overhead or cost of these additional elements is typically proportional to the level of detection/correction provided. For example, single-error-correction, double-error-detection ("SECDED") protection for 30 bytes of data uses 7 check bits and Double Error Correcting and Triple Error Detection ("DECTED") protection for 30 bytes of data uses 13 check bits. Described herein are techniques to achieve similar results as provided by DECTED protection while using less overhead. For example, the techniques described herein introduce Double Consecutive Error Correction Any Double Error Detection Code (DCECADED), which can result in protection for 30 bytes of data using 9 check bits. DCECADED can achieve results similar to those of DECTED while using 30% less overhead than DECTED.

Figure 1:
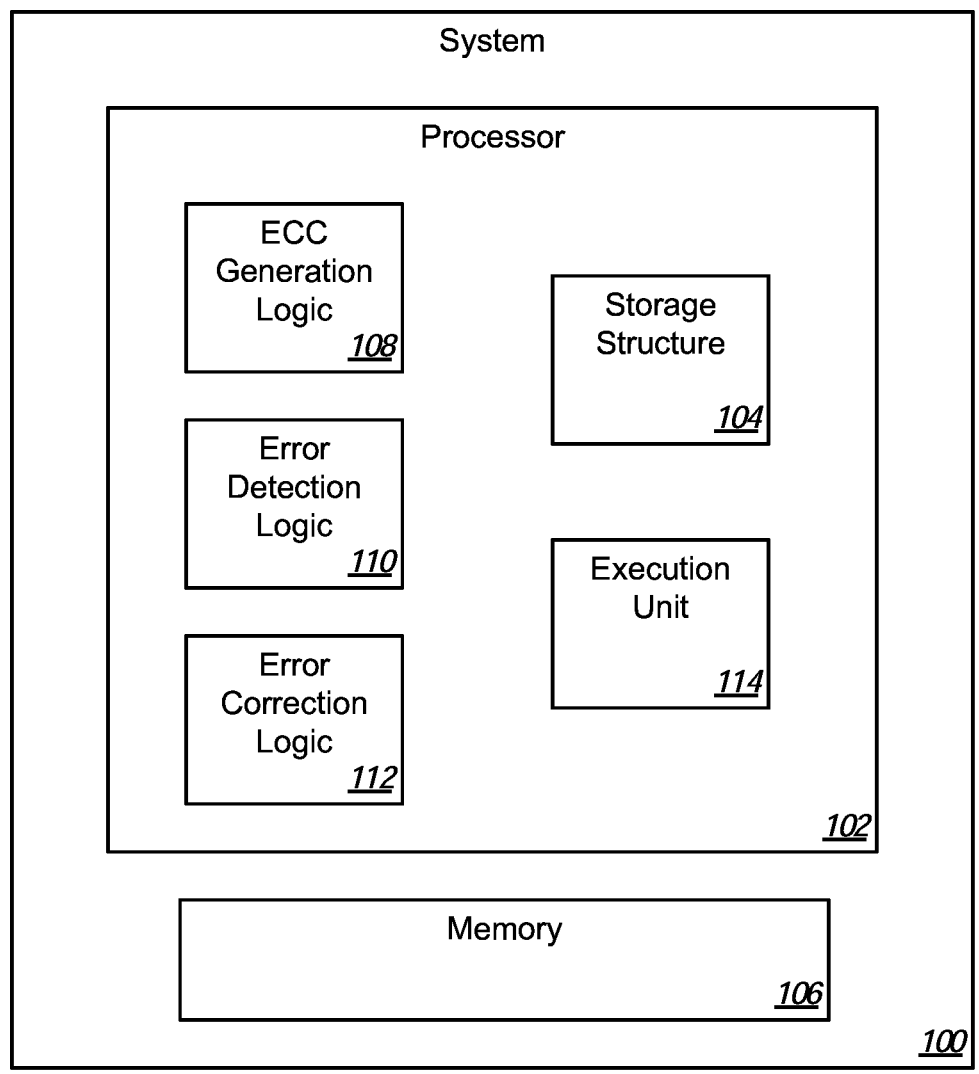
FIG. 1 illustrates information processing system that includes error correction code (ECC) for identifying and correcting data errors according to embodiments.

FIG. 1 illustrates information processing system 100 that includes error correction code (ECC) for identifying and correcting data errors. System 100 includes processor 102, storage structure 104, and system memory 106. Processor 102 includes ECC generation logic 108, error detection logic 110, error correction logic 112, and execution unit 114, and, in the embodiment of FIG. 1, storage structure 104 is integrated into processor 102. However, other embodiments, in which storage structure 104 is external to processor 102, are possible within the scope of the present disclosure. System 100 may also include any number of additional processors, storage structures, devices, and/or any other components or elements. The components of FIG. 1 can reside on "a common carrier substrate," such as, for example, an integrated circuit ("IC") die substrate, a multi-chip module substrate or the like. Alternatively, the processor 102 may reside on one or more printed circuit boards, such as, for example, a mother board, a daughter board or other type of circuit card. In other implementations, the main memory and the processor 102 can reside on the same or different carrier substrates.

Processor 102 may be any type of processor, including a general purpose microprocessor, such as a processor in the Intel® Pentium® Processor Family, Intel® Xeon® Processor Family, Intel® Core™ Processor Family, or other processor family from Intel® Corporation, or another processor from another company, or a special purpose processor or microcontroller. Processor 102 may include multiple threads and multiple execution cores, in any combination. In one embodiment, the processor 102 is integrated in a single integrated circuit die having multiple hardware functional units (hereafter referred to as a multi-core system). The multi-core system may be a multi-core processor package, but may include other types of functional units than just processor cores. Functional hardware units may be processor cores, graphics cores (also referred to as graphics units), voltage regulator (VR) phases, input/output (I/O) interfaces (e.g., serial links, DDR memory channels) and their controllers, network controllers, fabric controllers, or any combination thereof.

Memory 106 includes any type of persistent or non-volatile media, such as a flash memory device, a solid-state device (SSD), a memristor, phase change memory (e.g., PCS, PCM, PCME, PCRAM, Ovonic Unified Memory, Chalcogenide RAM, C-RAM, etc.), or other storage or memory device. The memory 106 can be byte-addressable. Memory 106 stores instructions and/or data represented by data signals that are to be executed by the processor 102. The processor 102 is coupled to the 106 via a processor bus (not shown). In some implementations, the memory 106 is a dual-inline memory module (DIMM). Memory 106 may also include volatile memory, such as in the form of random access memory (RAM) or registers.

ECC generation logic 108 may include any circuitry, logic, or other hardware, software, firmware, or structures to generate check values to be used to detect and/or correct errors in data. For example, ECC generation logic 108 may include an exclusive OR (XOR) gate to generate a parity bit that would be set to a logical '1' value when the number of inputs having a logical '1' value is odd and set to a logical '0' value when the number of inputs having a logical '1' value is even. The check values may be single parity bits, multiple parity bits, ECC values, check bits and/or any other types of values that may be used to detect and/or correct errors in data values. For example, for a 30-bit data value, a 10-bit ECC value may be generated, where each bit of the 10-bit ECC value is generated by calculating parity over the 30 data bits using a generator matrix, as described herein. The check value generation may be performed at any time relative to the execution of the instruction associated with the generation of the data value, fetching of the data value, and/or storing of the data value. For example, a check value may be generated in parallel with the generation of the data value, before the data value is stored, or after the data value is stored.

Error detection logic 110 may include any circuitry, logic, or other hardware, software, firmware, or structures to use the generated check values to detect errors in data values. For example, error detection logic 110 may include parity checking circuitry or logic using parity or ECC values generated by check value generation logic 108. Error detection logic 110 may indicate the detection of an error according to any approach, such as by generating a fault or an exception.

Error correction logic 112 may include any circuitry, logic, or other hardware, software, firmware, or structures to use the generated check values to correct errors in data values. For example, error correction logic 112 may include ECC circuitry or logic to correct errors in data values using ECC values generated by ECC generation logic 108, as further described in conjunction with FIG. 2.

ECC generation logic 108, error detection logic 110, and/or error correction logic 112 may be implemented separately or together, in circuitry, logic, hardware, software, firmware, or other structures dedicated to performing their function or in circuitry, logic, hardware, software, firmware, or other structures capable of performing additional functions, according to any other known approach, in whole or in part. For example, ECC generation logic 108, error detection logic 110, and error correction logic 112 may be included in a general purpose arithmetic-logic unit of processor 102, and/or may be included in dedicated hardware within processor 102 and/or software or firmware executable by processor 102.

Storage structure 104 may represent any structure to store information, including data and/or instructions, in an information processing system, such as a register, a cache, or another type of memory structure. For example, storage structure 104 may represent a last level data cache memory in processor 102. Storage structure 104 may include data storage structure (not shown) to store data or other information, and check value storage structure (not shown) to store check values generated by ECC generation logic 108 based on the data or other information. Alternatively, check value storage structure may be included anywhere else in system 100. Data storage structure and check value storage structure may include any type of individual storage elements, such as latches or flip-flops, to store bits of data. ECC generation logic 108, error detection logic 110, and/or error correction logic 112 may be coupled to the storage structure 104 (and data storage structure and check value storage structure) according to any known approach to implement embodiments of the present disclosure as described herein.

Figure 2:
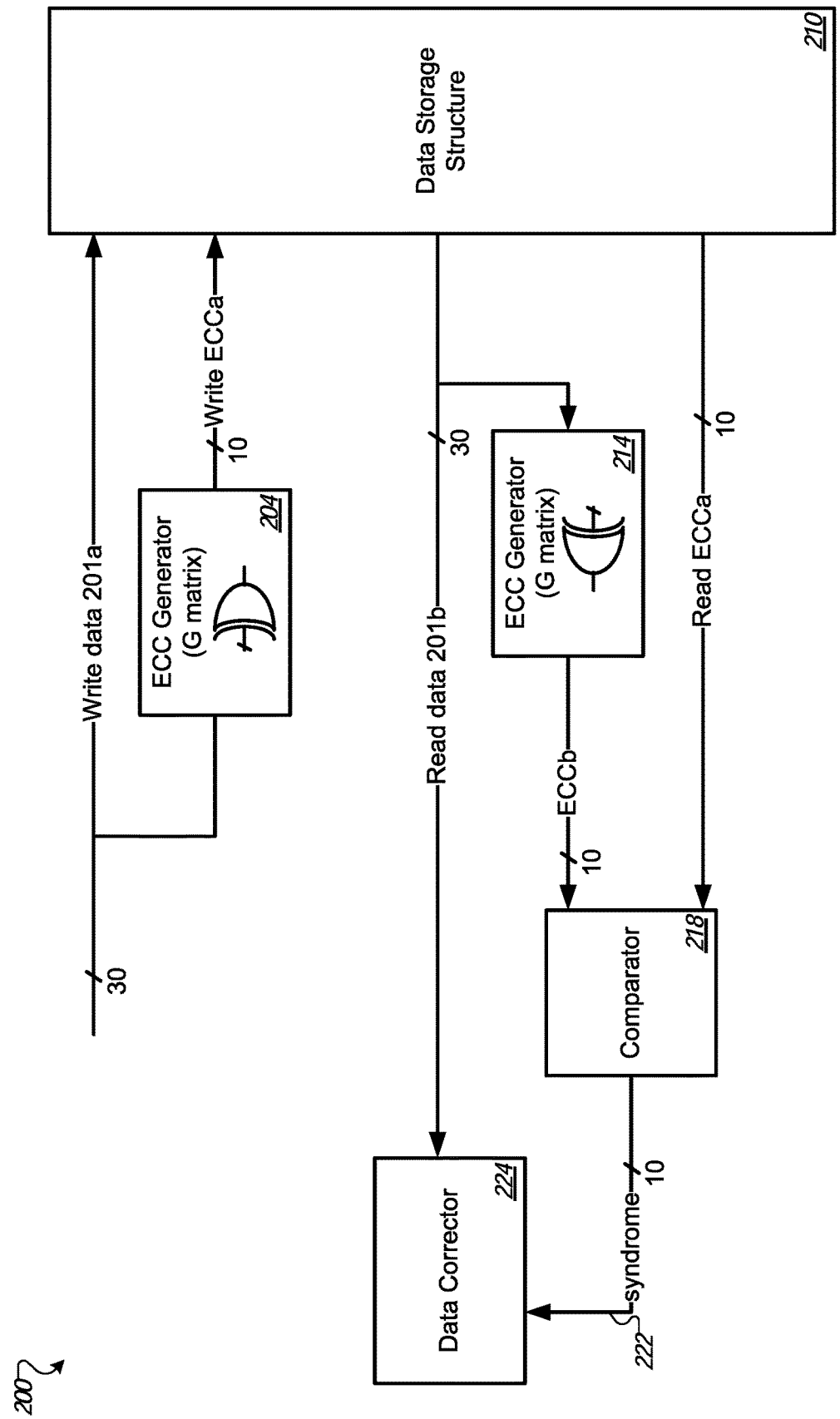
FIG. 2 illustrates a block diagram of ECC logic for double consecutive error correction in accordance with embodiments.

FIG. 2 illustrates a block diagram of ECC logic 200 for double consecutive error correction in accordance with embodiments. For simplicity of explanation and by way of example, FIG. 2 is described herein in terms of 30 data bits and 10 ECC bits. Any number of data bits and ECC bits are contemplated.

During operation, ECC logic 200 receives data 201a (e.g., 30 data bits) to be written to data storage structure 210. In implementations, the data storage structure 210 is the storage structure 104 of FIG. 1. An ECC generator 204 can receive the data 201a. The ECC generator 204 may include any circuitry, logic, or other hardware, software, firmware, or structures to generate check values. The ECC generator 204 can include an encoder unit. The encoder unit has ECC generation logic (e.g., ECC generation logic 108 of FIG. 1) to generate an ECCa using, based on, or corresponding to the data 201a received at 202. In one or more embodiments, the ECC generation logic may represent or implement a generator matrix or G-matrix to generate the ECCa. An example of a generator matrix is depicted in Table 1 below. The ECCa may represent parity bits or redundant bits that may allow errors in the data to be corrected as described herein. The encoder unit is coupled with the data storage structure 210. The encoder unit may provide the data 201a and the corresponding ECCa to the data storage structure 210, where they may be stored.

The structure of the generator matrix or G-matrix has dimensions k×n, where k is the number of information bits in data 201a and n is a length of a codeword. In implementations, a codeword has an even number of values. In an example and as depicted in Table 1, when data 201a is 30 bits and the length of a codeword is 10 bits, then the G-matrix is 30×10 bits (e.g., 0-29 bits×0-9 bits). In this example, each row of the matrix is 10 bits long and corresponds to an information bit. Each position in the G-matrix can be populated by one of two possible binary values (e.g., a 1 or a 0).

TABLE 1

Example Generator Matrix

| data bit # | 9 | 8 | 7 | 6 | 5 | 4 | 3 | 2 | 1 | 0 |
|---|---|---|---|---|---|---|---|---|---|---|
| 0 | 1 | 0 | 0 | 0 | 1 | 0 | 0 | 0 | 0 | 1 |
| 1 | 0 | 1 | 1 | 0 | 0 | 0 | 1 | 1 | 1 | 0 |
| 2 | 1 | 1 | 0 | 1 | 1 | 0 | 0 | 0 | 0 | 1 |
| 3 | 1 | 0 | 0 | 0 | 0 | 1 | 1 | 1 | 1 | 0 |
| 4 | 0 | 1 | 0 | 1 | 1 | 0 | 1 | 0 | 0 | 1 |
| 5 | 1 | 0 | 1 | 1 | 0 | 1 | 0 | 1 | 0 | 0 |
| 6 | 0 | 0 | 0 | 0 | 1 | 0 | 1 | 0 | 0 | 1 |
| 7 | 1 | 1 | 1 | 1 | 0 | 0 | 0 | 0 | 1 | 0 |
| 8 | 0 | 0 | 0 | 0 | 1 | 1 | 0 | 1 | 1 | 1 |
| 9 | 1 | 1 | 0 | 1 | 0 | 1 | 1 | 0 | 0 | 0 |
| 10 | 0 | 0 | 1 | 0 | 1 | 0 | 0 | 0 | 1 | 0 |
| 11 | 0 | 1 | 0 | 1 | 0 | 1 | 0 | 1 | 0 | 1 |
| 12 | 1 | 0 | 1 | 1 | 1 | 0 | 0 | 0 | 1 | 0 |
| 13 | 0 | 0 | 0 | 0 | 1 | 1 | 1 | 1 | 0 | 1 |
| 14 | 1 | 1 | 0 | 1 | 0 | 0 | 0 | 0 | 1 | 1 |
| 15 | 0 | 0 | 1 | 0 | 1 | 1 | 0 | 0 | 0 | 0 |
| 16 | 1 | 0 | 0 | 1 | 0 | 0 | 1 | 1 | 1 | 0 |
| 17 | 0 | 1 | 1 | 0 | 1 | 1 | 0 | 0 | 1 | 0 |
| 18 | 0 | 0 | 0 | 1 | 0 | 1 | 1 | 0 | 0 | 0 |
| 19 | 1 | 1 | 0 | 0 | 0 | 1 | 0 | 0 | 1 | 1 |
| 20 | 0 | 0 | 0 | 1 | 1 | 0 | 1 | 0 | 0 | 0 |
| 21 | 1 | 1 | 1 | 0 | 0 | 0 | 1 | 0 | 0 | 1 |
| 22 | 1 | 0 | 0 | 1 | 0 | 1 | 1 | 0 | 1 | 0 |
| 23 | 0 | 1 | 1 | 0 | 0 | 0 | 1 | 0 | 0 | 0 |
| 24 | 1 | 0 | 0 | 0 | 0 | 1 | 1 | 0 | 1 | 1 |
| 25 | 0 | 1 | 0 | 1 | 1 | 0 | 0 | 1 | 1 | 0 |
| 26 | 0 | 0 | 1 | 0 | 0 | 0 | 1 | 0 | 0 | 1 |
| 27 | 0 | 1 | 0 | 0 | 1 | 1 | 0 | 1 | 1 | 0 |
| 28 | 0 | 0 | 1 | 1 | 0 | 0 | 1 | 0 | 1 | 1 |
| 29 | 1 | 1 | 0 | 0 | 0 | 0 | 0 | 1 | 0 | 0 |

The structure of the G-matrix can be governed by multiple rules. For example, a rule A can specify that the number of 1s in a row is odd and is greater than 1. For a codeword length of 10 for example, each row can have three, five, seven, or nine 1s. Another example rule B can specify that an XOR operation performed on any two consecutive rows of the G-matrix results in a predefined number of values. For example, under this rule B and for a codeword length of 10, an XOR of any two rows can yield a syndrome that contains eight 1s, the eight 1s being the predefined number of values. In a specific example using Table 1, the XOR of rows 2 and 3=XOR(1101100001, 1000011110)=0101111111, which has eight 1s. Another rule C can specify that an XOR operation performed on any two non-consecutive rows results in a syndrome with a number of values that does not match the predefined number of values associated with two consecutive rows as defined by rule B. For example, if two consecutive rows have syndrome with eight 1s, syndromes for any two non-consecutive rows does not have eight 1s. In a specific example and referring to Table 1, the XOR of rows 2 and 3 has eight 1s and the XOR of rows 2 and 7=XOR (1101100001, 1111000010)=0010100011, which has four is (not eight). A further rule D can specify that an XOR operation performed on any two consecutive rows yields a syndrome that does not match any other syndromes generated from any other two consecutive rows. In a specific example using Table 1, the XOR of rows 2 and 3=0101111111 (as derived above) and the XOR of rows 23 and 24=XOR(0110000100, 1000011011)=1110011111, which is different than the XOR 0101111111 of rows 2 and 3.

In some implementations, after the G-matrix is formed, a lookup table (e.g., correlation table) can also be generated from the G-matrix. The lookup table can have one fewer row than the G-matrix. Each row can correspond to two consecutive bits of the data 201a. As depicted in Table 2 for example, the first row corresponds to data bits (0,1), the second row corresponds to data bits (1,2), and so on. The lookup table can include multiple columns, where one column includes identification information for the two consecutive bits (e.g., data bits (7,8)) as described herein. The lookup table can have an additional number of columns equal to the codeword length. As illustrated in Table 2, each of the positions can indicate a result of a bit-by-bit XOR operation (e.g., a syndrome) for two consecutive rows of the G-matrix. For example, the row for data bits (13,14) of Table 2 includes values that resulted from an XOR operation for each bit of rows 13 and 14 of Table 1. In some implementations, the bits of the syndrome are concatenated, which can be represented in a single column instead of in a bit-wise manner as illustrated.

TABLE 2

Example Lookup Table

| data bit #s | Syndromes of Consecutive Errors | | | | | | | | | |
|---|---|---|---|---|---|---|---|---|---|---|
| | 9 | 8 | 7 | 6 | 5 | 4 | 3 | 2 | 1 | 0 |
| 0, 1 | 1 | 1 | 1 | 0 | 1 | 0 | 1 | 1 | 1 | 1 |
| 1, 2 | 1 | 0 | 1 | 1 | 1 | 0 | 1 | 1 | 1 | 1 |
| 2, 3 | 0 | 1 | 0 | 1 | 1 | 1 | 1 | 1 | 1 | 1 |
| 3, 4 | 1 | 1 | 0 | 1 | 1 | 1 | 0 | 1 | 1 | 1 |
| 4, 5 | 1 | 1 | 1 | 0 | 1 | 1 | 1 | 1 | 0 | 1 |
| 5, 6 | 1 | 0 | 1 | 1 | 1 | 1 | 1 | 1 | 0 | 1 |
| 6, 7 | 1 | 1 | 1 | 1 | 0 | 1 | 0 | 1 | 1 | 1 |
| 7, 8 | 1 | 1 | 1 | 1 | 1 | 1 | 0 | 1 | 0 | 1 |
| 8, 9 | 1 | 1 | 0 | 1 | 1 | 0 | 1 | 1 | 1 | 1 |
| 9, 10 | 1 | 1 | 1 | 1 | 1 | 1 | 1 | 0 | 1 | 0 |
| 10, 11 | 0 | 1 | 1 | 1 | 1 | 1 | 0 | 1 | 1 | 1 |
| 11, 12 | 1 | 1 | 1 | 0 | 1 | 1 | 0 | 1 | 1 | 1 |
| 12, 13 | 1 | 0 | 1 | 1 | 0 | 1 | 1 | 1 | 1 | 1 |
| 13, 14 | 1 | 1 | 0 | 1 | 1 | 1 | 1 | 1 | 1 | 0 |
| 14, 15 | 1 | 1 | 1 | 1 | 1 | 1 | 0 | 0 | 1 | 1 |
| 15, 16 | 1 | 0 | 1 | 1 | 1 | 1 | 1 | 1 | 1 | 0 |
| 16, 17 | 1 | 1 | 1 | 1 | 1 | 1 | 1 | 1 | 0 | 0 |
| 17, 18 | 0 | 1 | 1 | 1 | 1 | 1 | 1 | 1 | 1 | 0 |
| 18, 19 | 1 | 1 | 0 | 1 | 0 | 1 | 1 | 1 | 1 | 1 |
| 19, 20 | 1 | 1 | 0 | 1 | 1 | 1 | 1 | 0 | 1 | 1 |
| 20, 21 | 1 | 1 | 1 | 1 | 1 | 0 | 1 | 0 | 0 | 1 |
| 21, 22 | 0 | 1 | 1 | 1 | 0 | 1 | 1 | 1 | 1 | 1 |
| 22, 23 | 1 | 1 | 1 | 1 | 0 | 1 | 1 | 1 | 1 | 0 |
| 23, 24 | 1 | 1 | 1 | 0 | 0 | 1 | 1 | 1 | 1 | 1 |
| 24, 25 | 1 | 1 | 0 | 1 | 1 | 1 | 1 | 1 | 0 | 1 |
| 25, 26 | 0 | 1 | 1 | 1 | 1 | 0 | 1 | 1 | 1 | 1 |
| 26, 27 | 0 | 1 | 1 | 0 | 1 | 1 | 1 | 1 | 1 | 1 |
| 27, 28 | 0 | 1 | 1 | 1 | 1 | 1 | 1 | 1 | 0 | 1 |
| 28, 29 | 1 | 1 | 1 | 1 | 0 | 0 | 1 | 1 | 1 | 1 |

At any time, errors can be introduced to data 201a, such as by alpha particles coming in physical contact with a device that is storing the data 201a, as described herein. To check whether data 201a includes any errors (such as when reading the data 201a from the data storage structure 210), the ECC logic 200 designates the accessed data as data 201b such that the ECC logic 200 can compare the accessed data 201b against the received data 201a. When there are no errors in data 201b, then data 201b is the same as data 201a. When there is at least one error in data 201b, then the ECC logic 200 can be used to identify and correct single errors and double consecutive errors and to identify any two errors.

At any time, the ECC logic 200 can access (e.g., read) the data 201b that is stored in the data storage structure 210. To detect errors in the data 201b, an ECC generator 214 that is the same or similar to ECC generator 204 can include ECC generation logic to generate an new ECCb using, based on, or corresponding to the data 201b. ECCa and ECCb can be provided to a comparator 218.

The comparator 218 may include decoder logic including check bit confirmation logic to confirm that the ECCa and ECCb are mutually consistent. In one or more embodiments, the check bit confirmation logic may check (e.g., calculate syndromes based on) the ECCa and ECCb. A syndrome can be a comparison result that is calculated using an XOR operation on the ECCa and ECCb. The comparator 218 can pass the syndrome to the data corrector 224.

The data corrector 224 can use the syndrome it receives from the comparator 218 to identify and correct errors in data 201b. Syndromes equal to zero (e.g., all values are 0) may indicate that there are no errors in the data or check bits. Syndromes not equal to zero may indicate one or more errors (e.g., one or more bits of the data or check bits have an incorrect bit value). In implementations, when a syndrome matches a row of the generator matrix, the error is a single bit error that the data corrector 224 can process and correct.

When a syndrome is not equal to zero and a count of values in the syndrome corresponds to a predefined number, then the data 201b has errors on two consecutive rows. For example, as described above in conjunction with Table 1, a rule B can specify a predefined number of values (e.g., eight 1s). When the comparator 218 generates a comparison result (e.g., a syndrome) between ECCa and ECCb that has the predefined number of values, then data 201b has two consecutive bits with errors. To identify which two bits of data 201b have errors, the data corrector 224 can access a lookup table, such as Table 2. Using the comparison result, the comparator 218 can identify the two rows. In an example, when the example G-matrix described above in conjunction with FIG. 1 was generated, a predefined number of values was set to eight, such that the XOR of any two consecutive rows of the G-matrix resulted in eight 1s. When the data corrector 224 receives a syndrome of 1111111100, the data corrector 224 counts the number of is and determines that the syndrome has eight 1s. Since this is the predefined number of values, the data corrector 224 determines that data 201b has two consecutive rows with errors. The data corrector 224 can then access a lookup table and, using the syndrome of 1111111100, can identify two consecutive bits of the data 201b that correspond to that syndrome. In this example, a syndrome of 1111111100 corresponds to data bits 16 and 17, as illustrated in Table 2. The data corrector 224 can make the appropriate correction to data bits 16 and 17 (e.g., changing the values in each bit, flipping the bits). In some implementations, once the data corrector 224 receives a syndrome, it performs XOR operations on rows of the G-matrix until it identifies a match to the received syndrome without using the lookup table. In some implementations, the corrector 224 can use a decoder to identify the syndrome of two rows of the G-matrix without requiring a lookup table.

When a syndrome is not equal to zero but the number of values does not equal the predefined number, then the error is an uncorrectable error. For example, when a comparison result is 1111000011, this syndrome does not have the predefined number of values (e.g., eight 1s), thus, the error is an uncorrectable error. When a syndrome matches one of the rows of Table 1, there is a single error in the data 201b that is correctable using a similar same correction method as for correcting double consecutive errors but using Table 1 as a lookup table instead of Table 2.

In implementations, the data storage structure 210 can be different storage locations. For example, data 201a and ECCa can be written to a first data storage structure, such as a memory block. The data 201a and ECCa can be moved to another memory block which is later accessed to obtain data 201b. In some implementations, data 201a and ECCa is transmitted (e.g., wirelessly transmitted) to another data storage structure, such as to a storage structure on another device (not shown). The other device stores the data 201a as data 201b and stores the ECCa. The other device can include an ECC generator 214, comparator 218 and data corrector 224 that it can use to detect errors in data 201b, as described herein.

In some implementations, the techniques described herein can be used to detect and correct errors in the ECCa.

Figure 3:
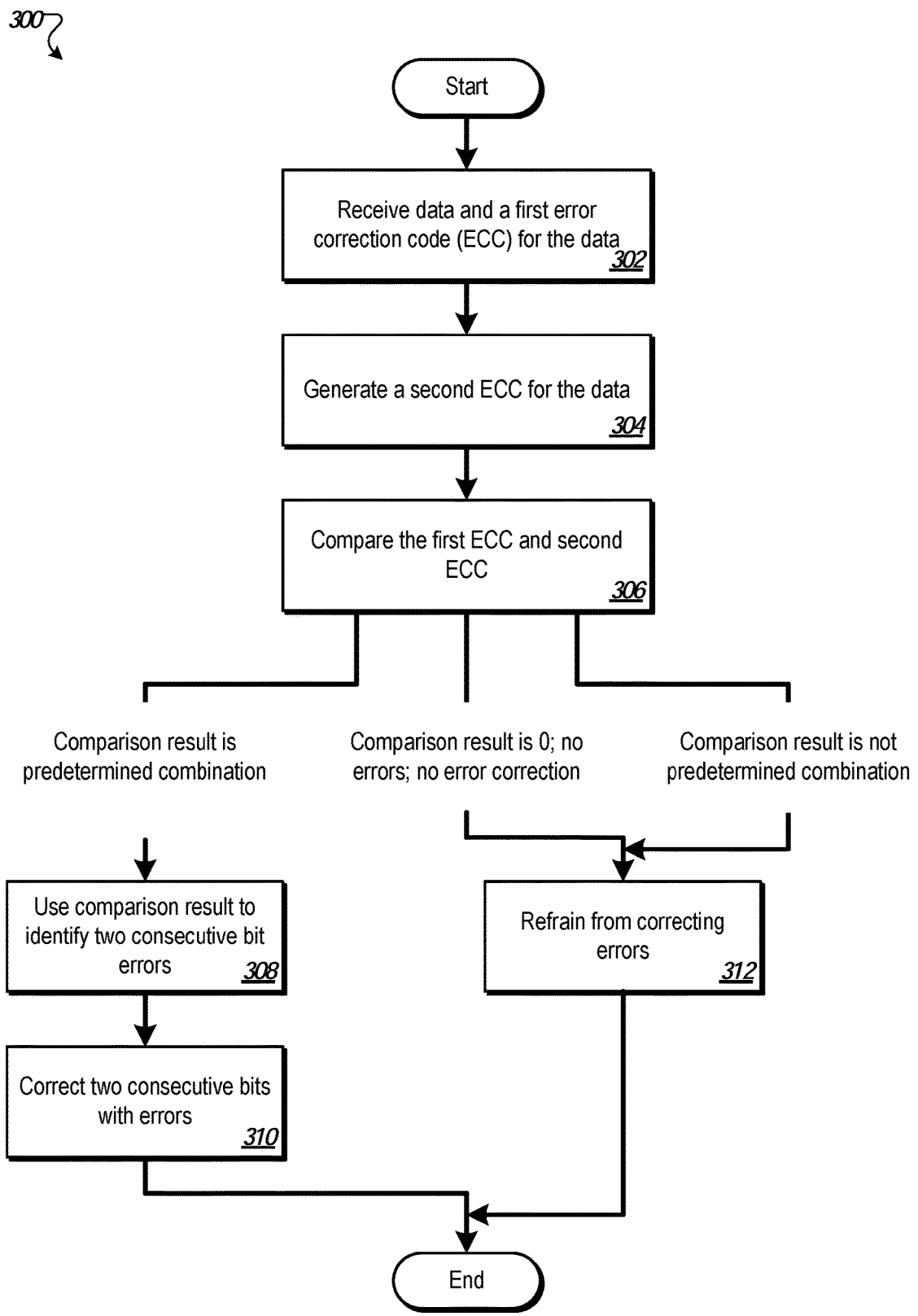
FIG. 3 illustrates a method for performing error code correction according to embodiments.

FIG. 3 illustrates a method 300 for performing error code correction according to embodiments. Method 300 may be performed by processing logic that may comprise hardware (e.g., circuitry, dedicated logic, programmable logic, microcode, etc.), software (such as operations being performed by a functional unit), firmware or a combination thereof. In implementations, method 300 is performed by a processor, such as processor 102 of FIG. 1.

Referring to FIG. 3, the method 300 begins at block 302 by processing logic receives a set of data and a first error correction code that corresponds to the set of data. The set of data can include multiple data bits. The first error correction code was generated using a generator matrix having a number of bit groups (e.g., rows) equal to a number of data bits and where each bit group has a unique set of bit positions.

At block 304, the processing logic generates a second error correction code that corresponds to the received set of data. The processing logic can generate the second error correction code based on the generator matrix.

At block 306, the processing logic compares the first error correction code and the second error correction code. In implementations, the processing logic generates a comparison result (e.g., a syndrome) of the first error correction code and the second error correction code.

When the comparison result is a predefined number of values or a predefined combination of values (e.g., has eight 1s), the processing logic can use the comparison result at block 308 to identify two consecutive bits with errors. In implementations, the processing logic corrects two consecutive bits when the comparison result corresponds to a result of an exclusive-or (XOR) operation performed on two consecutive bit groups of the generator matrix. In implementations, to identify the two consecutive bits with errors, the processing logic can use the comparison result as a key in a lookup table to identify the two consecutive bits. Once the processing logic has identified the two consecutive bits with errors, the processing logic can correct the two consecutive bits with errors a block 310. In implementations, correcting the two consecutive bits includes inverting the values of the bits.

When a syndrome matches one of the rows of the generator matrix, there is a single error in the data 201b that is correctable using a similar same correction method as for correcting double consecutive errors while using the generator matrix as the lookup table.

When the first error correction code and the second error correction code are the same (e.g., the comparison result is zero), the processing logic refrains from correcting errors at block 312 and can proceed with other operations.

When the comparison result is not zero and the comparison result does not correspond to the predefined number, the data has at least one uncorrectable error and processing logic refrains from correcting errors at block 312 and can proceed with other operations.

Figure 4:
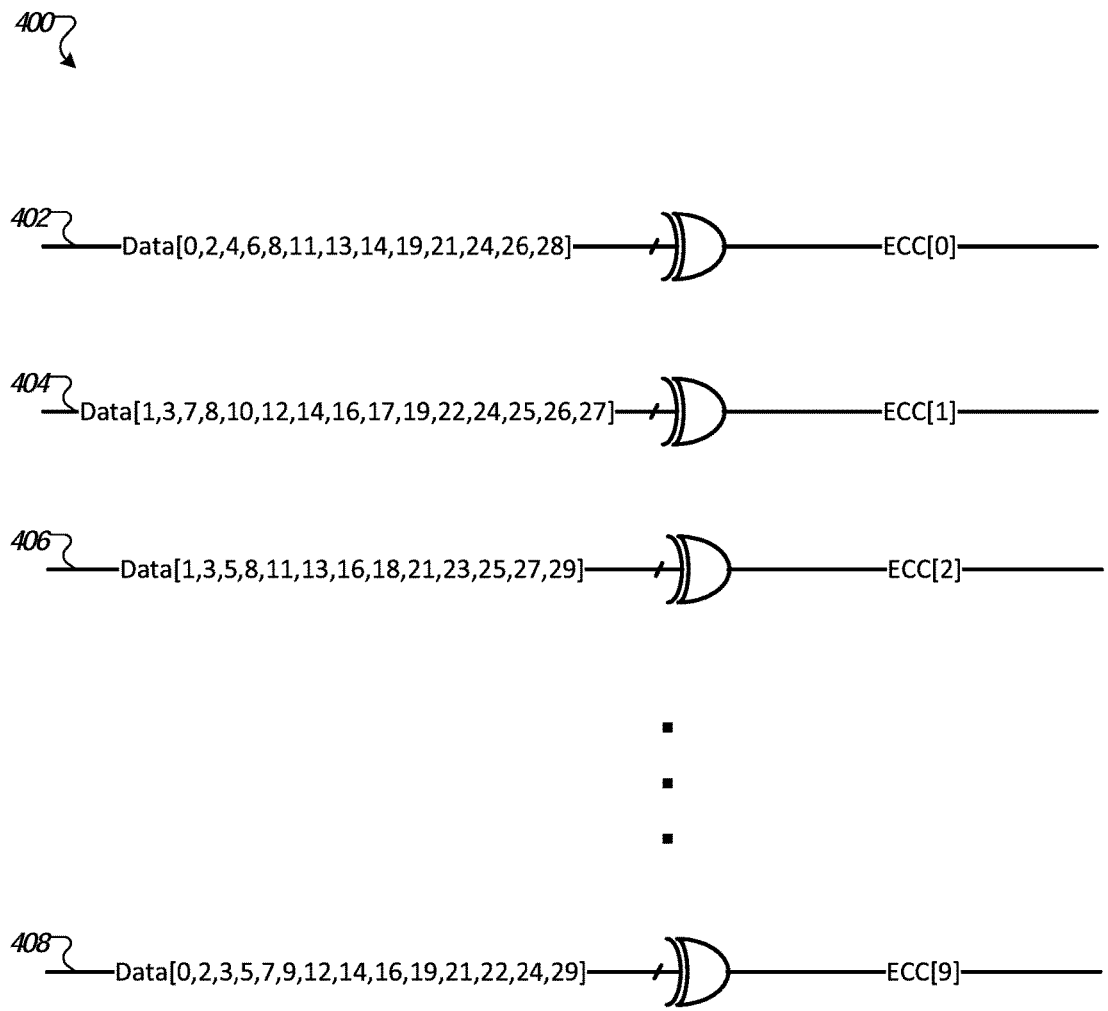
FIG. 4 illustrates an example generator matrix in circuit form, in accordance with embodiments.

FIG. 4 illustrates an example generator matrix 400 in circuit form, in accordance with embodiments. The generator matrix 400 includes one circuit 402, 404, 406, 408 for each bit in an error correction code. As illustrated, the generator matrix 400 has 10 error correction bits (e.g., bits 0-9). By way of example, the illustrated circuits correspond to Table 1. Circuits corresponding to error correction bits 3-8 are not illustrated to avoid unnecessarily obscuring the present disclosure. Circuit 402 corresponds to ECC bit 0 and indicates that ECC bit 0 is affected by data bits [0,2,4,6,8, 11,13,14,19,21,24,26,28] of the generator matrix 400. Circuits 404, 406 and 408 illustrate similar features. In some implementations the generator matrix 400 can be transmitted in this form along with data in order to instruct the receiving entity on how to construct the generator matrix 400.

Figure 5:
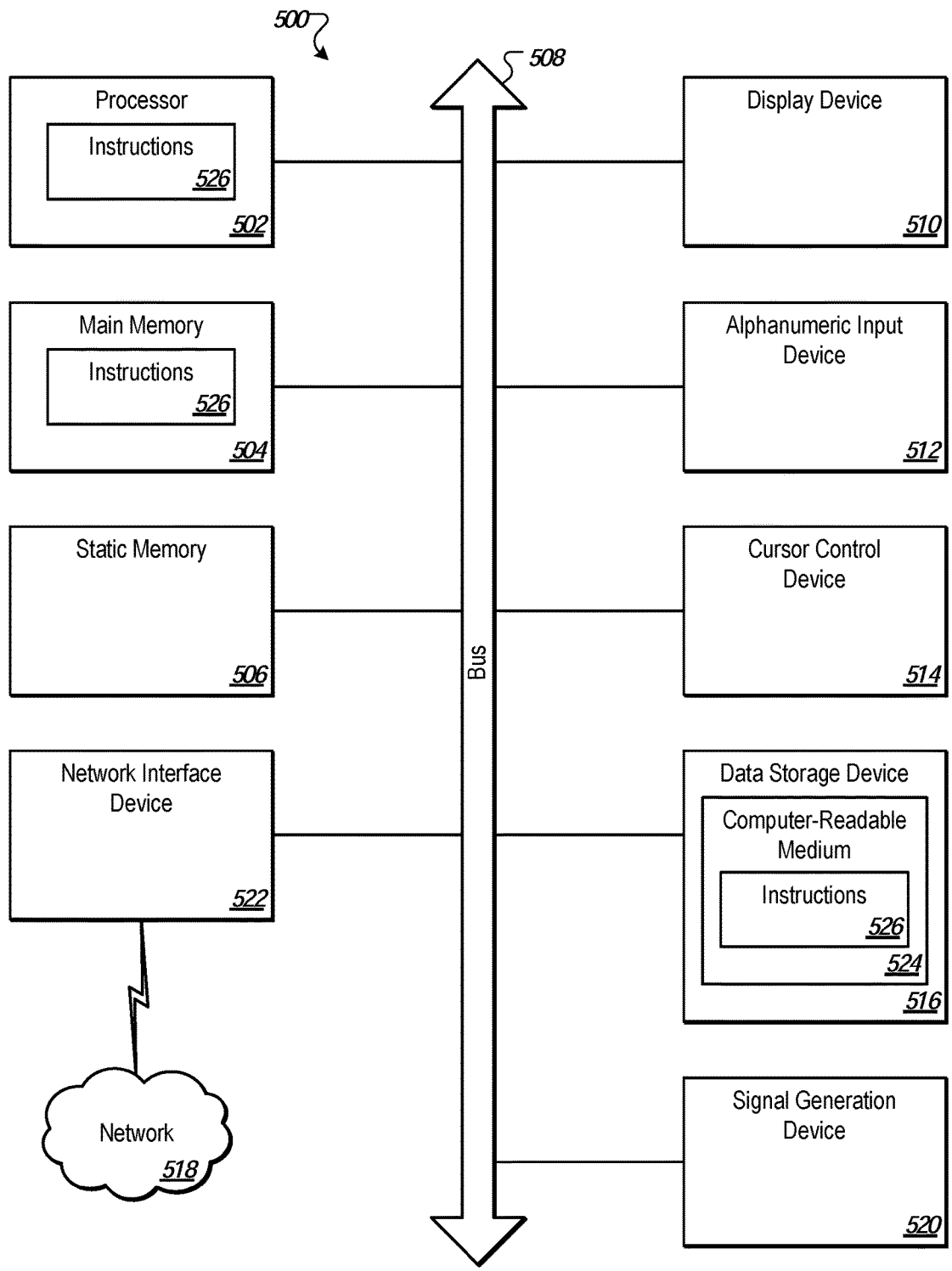
FIG. 5 illustrates a diagrammatic representation of a machine in the example form of a computing system according to embodiments.

FIG. 5 illustrates a diagrammatic representation of a machine in the example form of a computing system 500 within which a set of instructions, for causing the machine to perform any one or more of the methodologies discussed herein, may be executed. In alternative embodiments, the machine may be connected (e.g., networked) to other machines in a LAN, an intranet, an extranet, or the Internet. The machine may operate in the capacity of a server or a client device in a client-server network environment, or as a peer machine in a peer-to-peer (or distributed) network environment. The machine may be a personal computer (PC), a tablet PC, a set-top box (STB), a Personal Digital Assistant (PDA), a game console, a cellular telephone, a digital camera, a handheld PC, a web appliance, a server, a network router, switch or bridge, micro controller, a digital signal processor (DSP), system on a chip, network computers (NetPC), network hubs, wide area network (WAN) switches, or any machine capable of executing a set of instructions (sequential or otherwise) that specify actions to be taken by that machine. Further, while only a single machine is illustrated for the processing device 100, the term "machine" shall also be taken to include any collection of machines that individually or jointly execute a set (or multiple sets) of instructions to perform any one or more of the methodologies discussed herein. Embodiments are not limited to computer systems.

The computing system 500 includes a processing device 502, main memory 504 (e.g., read-only memory (ROM), flash memory, dynamic random access memory (DRAM) (such as synchronous DRAM (SDRAM) or DRAM (RDRAM), etc.), a static memory 506 (e.g., flash memory, static random access memory (SRAM), etc.), and a data storage device 516, which communicate with each other via a bus 508.

Processing device 502 represents one or more general-purpose processing devices such as a microprocessor, central processing unit, or the like. More particularly, the processing device may be complex instruction set computing (CISC) microprocessor, reduced instruction set computer (RISC) microprocessor, very long instruction word (VLIW) microprocessor, or processor implementing other instruction sets, or processors implementing a combination of instruction sets. Processing device 502 may also be one or more special-purpose processing devices such as an application specific integrated circuit (ASIC), a field programmable gate array (FPGA), a digital signal processor (DSP), network processor, or the like. In one embodiment, processing device 502 may include one or processing cores. The processing device 502 is configured to execute the processing logic 526 for performing the operations discussed herein. In one embodiment, processing device 502 can be part of the system 100 of FIG. 1. Alternatively, the computing system 500 can include other components as described herein. It should be understood that the core may support multithreading (executing two or more parallel sets of operations or threads), and may do so in a variety of ways including time sliced multithreading, simultaneous multithreading (where a single physical core provides a logical core for each of the threads that physical core is simultaneously multithreading), or a combination thereof (e.g., time sliced fetching and decoding and simultaneous multithreading thereafter such as in the Intel® Hyperthreading technology).

Computing system 500 is representative of processing systems based on the PENTIUM III™, PENTIUM 4™, Celeron™, Xeon™, Itanium, XScale™, StrongARM™, Core™, Core 2™, Atom™, and/or Intel® Architecture Core™, such as an i3, i5, i7 microprocessors available from Intel Corporation of Santa Clara, Calif., although other systems (including PCs having other microprocessors, engineering workstations, set-top boxes and the like) may also be used. However, understand that other low power processors such as available from Advanced Micro Devices, Inc. (AMD) of Sunnyvale, Calif., a MIPS-based design from MIPS Technologies, Inc. of Sunnyvale, Calif., an ARM-based design licensed from ARM Holdings, Ltd. or customer thereof, or their licensees or adopters may instead be present in other embodiments such as an Apple A5/A6 processor, a Qualcomm Snapdragon processor, or TI OMAP processor. In one embodiment, processing device 101 executes a version of the WINDOWS™ operating system available from Microsoft Corporation of Redmond, Wash., although other operating systems (OS X, UNIX, Linux, Android, iOS, Symbian, for example), embedded software, and/or graphical user interfaces, may also be used. Thus, embodiments of the present disclosure are not limited to any specific combination of hardware circuitry and software. One embodiment may be described in the context of a single processor desktop or server system, but alternative embodiments may be included in a multiprocessor system. Computing system 500 may be an example of a 'hub' system architecture.

The computing system 500 may further include a network interface device 522 communicably coupled to a network 518. The computing system 500 also may include a display device 510 (e.g., a liquid crystal display (LCD) or a cathode ray tube (CRT)), an alphanumeric input device 512 (e.g., a keyboard), a cursor control device 514 (e.g., a mouse), a signal generation device 520 (e.g., a speaker), or other peripheral devices. Furthermore, computing system 500 may include a graphics processing unit (not illustrated), a video processing unit (not illustrated) and an audio processing unit (not illustrated). In another embodiment, the computing system 500 may include a chipset (not illustrated), which refers to a group of integrated circuits, or chips, that are designed to work with the processing device 502 and controls communications between the processing device 502 and external devices. For example, the chipset may be a set of chips on a motherboard that links the processing device 502 to very high-speed devices, such as main memory 504 and graphic controllers, as well as linking the processing device 502 to lower-speed peripheral buses of peripherals, such as USB, PCI or ISA buses.

The data storage device 516 may include a computer-readable storage medium 524 on which is stored instructions 526 embodying any one or more of the methodologies of functions described herein. The instructions 526 may also reside, completely or at least partially, within the main memory 504 as instructions 526 and/or within the processing device 502 as processing logic 526 during execution thereof by the computing system 500; the main memory 504 and the processing device 502 also constituting computer-readable storage media.

The computer-readable storage medium 524 may also be used to store instructions 526 utilizing the processing device 502, such as described with respect to FIG. 1, and/or a software library containing methods that call the above applications. While the computer-readable storage medium 524 is shown in an example embodiment to be a single medium, the term "computer-readable storage medium" should be taken to include a single medium or multiple media (e.g., a centralized or distributed database, and/or associated caches and servers) that store the one or more sets of instructions. The term "computer-readable storage medium" shall also be taken to include any medium that is capable of storing, encoding or carrying a set of instruction for execution by the machine and that cause the machine to perform any one or more of the methodologies of the present embodiments. The term "computer-readable storage medium" shall accordingly be taken to include, but not be limited to, solid-state memories, and optical and magnetic media.

Figure 6:
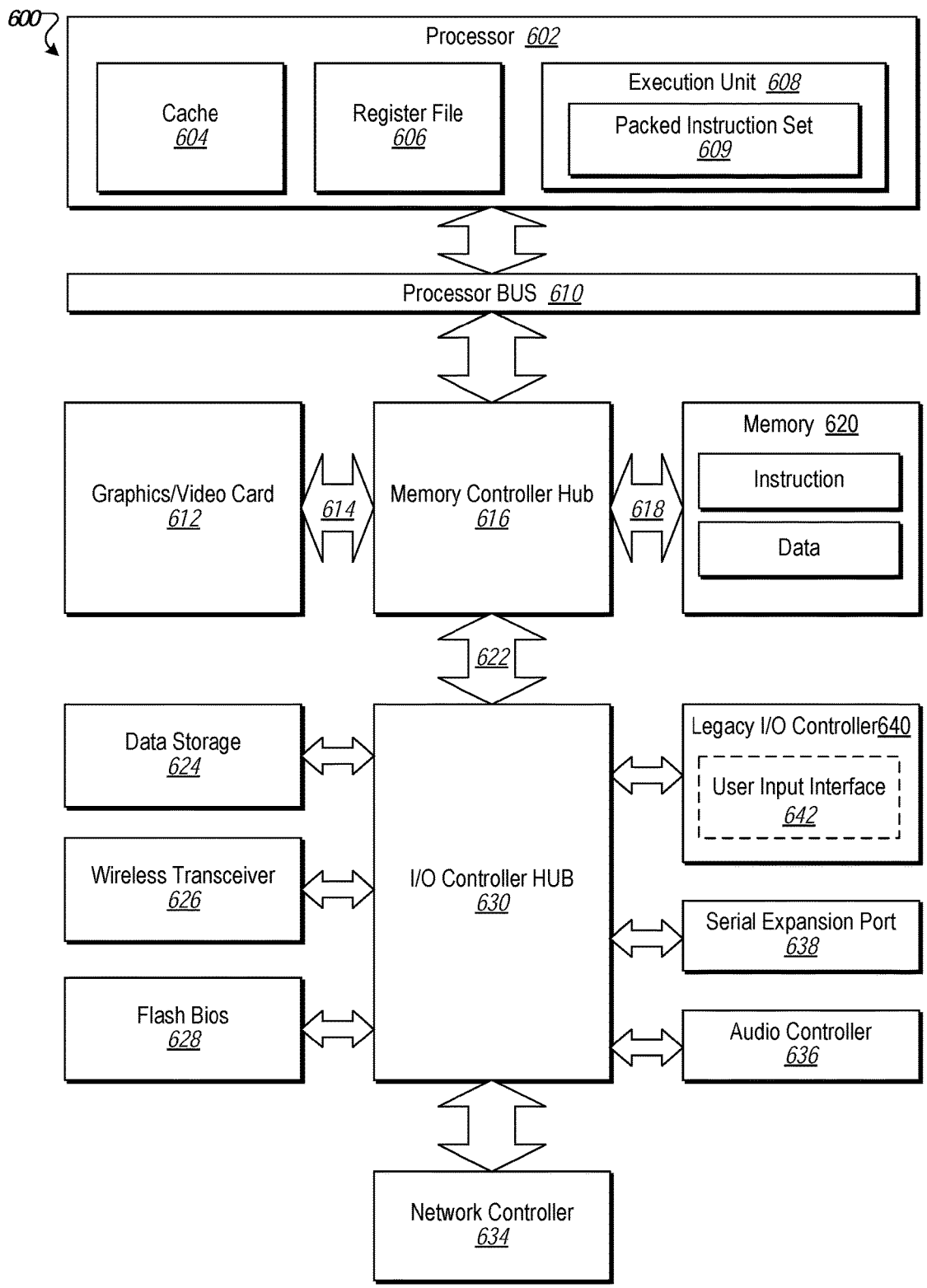
FIG. 6 is a block diagram of an exemplary computer system according to embodiments.

Turning to FIG. 6, a block diagram of an example computer system formed with a processor that includes execution units to execute an instruction, where one or more of the interconnects implement one or more features in accordance with one embodiment of the present disclosure is illustrated. System 600 includes a component, such as a processor 602 to employ execution units including logic to perform algorithms for processing data, in accordance with the embodiment described herein. Embodiments of the present disclosure are not limited to any specific combination of hardware circuitry and software.

Embodiments are not limited to computer systems. Alternative embodiments of the present disclosure can be used in other devices such as handheld devices and embedded applications. Some examples of handheld devices include cellular phones, Internet Protocol devices, digital cameras, personal digital assistants (PDAs), and handheld PCs. Embedded applications can include a micro controller, a digital signal processor (DSP), system on a chip, network computers (NetPC), set-top boxes, network hubs, wide area network (WAN) switches, or any other system that can perform one or more instructions in accordance with at least one embodiment.

In this illustrated embodiment, processor 602 includes one or more execution units 608 to implement an algorithm that is to perform at least one instruction. One embodiment may be described in the context of a single processor desktop or server system, but alternative embodiments may be included in a multiprocessor system. System 600 is an example of a 'hub' system architecture. The computer system 600 includes a processor 602 to process data signals. The processor 602, as one illustrative example, includes a complex instruction set computer (CISC) microprocessor, a reduced instruction set computing (RISC) microprocessor, a very long instruction word (VLIW) microprocessor, a processor implementing a combination of instruction sets, or any other processor device, such as a digital signal processor, for example. The processor 602 is coupled to a processor bus 610 that transmits data signals between the processor 602 and other components in the system 600. The elements of system 600 (e.g. graphics accelerator 612, memory controller hub 616, memory 620, I/O controller hub 624, wireless transceiver 626, Flash BIOS 628, Network controller 634, Audio controller 636, Serial expansion port 638, I/O controller 630, etc.) perform their conventional functions that are well known to those familiar with the art.

In one embodiment, the processor 602 includes a Level 1 (L1) internal cache memory 604. Depending on the architecture, the processor 602 may have a single internal cache or multiple levels of internal caches. Other embodiments include a combination of both internal and external caches depending on the particular implementation and needs. Register file 606 is to store different types of data in various registers including integer registers, floating point registers, vector registers, banked registers, shadow registers, checkpoint registers, status registers, and instruction pointer register.

Execution unit 608, including logic to perform integer and floating point operations, also resides in the processor 602. The processor 602, in one embodiment, includes a microcode (ucode) ROM to store microcode, which when executed, is to perform algorithms for certain macroinstructions or handle complex scenarios. Here, microcode is potentially updateable to handle logic bugs/fixes for processor 602. For one embodiment, execution unit 608 includes logic to handle a packed instruction set 609. By including the packed instruction set 609 in the instruction set of a general-purpose processor 602, along with associated circuitry to execute the instructions, the operations used by many multimedia applications may be performed using packed data in a general-purpose processor 602. Thus, many multimedia applications are accelerated and executed more efficiently by using the full width of a processor's data bus for performing operations on packed data. This potentially eliminates the need to transfer smaller units of data across the processor's data bus to perform one or more operations, one data element at a time.

Alternate embodiments of an execution unit 608 may also be used in micro controllers, embedded processors, graphics devices, DSPs, and other types of logic circuits. System 600 includes a memory 620. Memory 620 includes a dynamic random access memory (DRAM) device, a static random access memory (SRAM) device, flash memory device, or other memory device. Memory 620 stores instructions and/or data represented by data signals that are to be executed by the processor 602.

A system logic chip 616 is coupled to the processor bus 610 and memory 620. The system logic chip 616 in the illustrated embodiment is a memory controller hub (MCH). The processor 602 can communicate to the MCH 616 via a processor bus 610. The MCH 616 provides a high bandwidth memory path 618 to memory 620 for instruction and data storage and for storage of graphics commands, data and textures. The MCH 616 is to direct data signals between the processor 602, memory 620, and other components in the system 600 and to bridge the data signals between processor bus 610, memory 620, and system I/O 622. In some embodiments, the system logic chip 616 can provide a graphics port for coupling to a graphics controller 612. The MCH 616 is coupled to memory 620 through a memory interface 618. The graphics card 612 is coupled to the MCH 616 through an Accelerated Graphics Port (AGP) interconnect 614.

System 600 can use a proprietary hub interface bus 622 to couple the MCH 616 to the I/O controller hub (ICH) 630. The ICH 630 provides direct connections to some I/O devices via a local I/O bus. The local I/O bus is a high-speed I/O bus for connecting peripherals to the memory 620, chipset, and processor 602. Some examples are the audio controller, firmware hub (flash BIOS) 628, wireless transceiver 626, data storage 624, legacy I/O controller 640 containing user input and keyboard interfaces 642, a serial expansion port such as Universal Serial Bus (USB), and a network controller 634. The data storage device 624 can comprise a hard disk drive, a floppy disk drive, a CD-ROM device, a flash memory device, or other mass storage device.

For another embodiment of a system, an instruction in accordance with one embodiment can be used with a system on a chip. One embodiment of a system on a chip comprises of a processor and a memory. The memory for one such system is a flash memory. The flash memory can be located on the same die as the processor and other system components. Additionally, other logic blocks such as a memory controller or graphics controller can also be located on a system on a chip.

Figure 7:
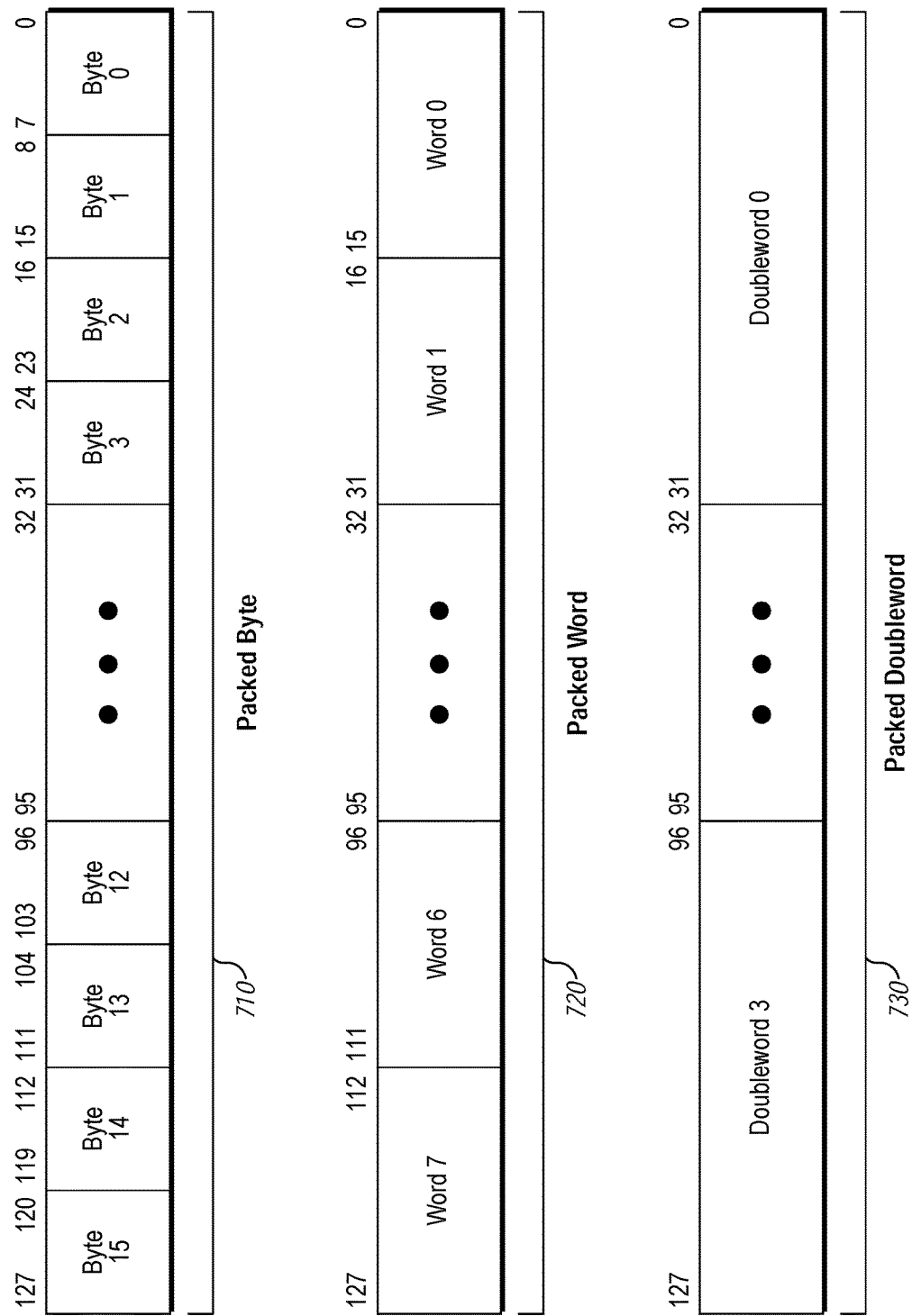
FIG. 7 illustrates packed data types according to embodiments.

FIG. 7 illustrates various packed data type representations in multimedia registers according to one embodiment of the present disclosure. FIG. 7 illustrates data types for a packed byte 710, a packed word 720, and a packed doubleword (dword) 730 for 128 bits wide operands. The packed byte format 710 of this example is 128 bits long and contains sixteen packed byte data elements. A byte is defined here as 8 bits of data. Information for each byte data element is stored in bit 7 through bit 0 for byte 0, bit 15 through bit 8 for byte 1, bit 23 through bit 16 for byte 2, and finally bit 120 through bit 127 for byte 15. Thus, all available bits are used in the register. This storage arrangement increases the storage efficiency of the processor. As well, with sixteen data elements accessed, one operation can now be performed on sixteen data elements in parallel.

Generally, a data element is an individual piece of data that is stored in a single register or memory location with other data elements of the same length. In packed data sequences relating to SSEx technology, the number of data elements stored in a XMM register is 128 bits divided by the length in bits of an individual data element. Similarly, in packed data sequences relating to MMX and SSE technology, the number of data elements stored in an MMX register is 64 bits divided by the length in bits of an individual data element. Although the data types illustrated in FIG. 7 are 128 bit long, implementations can also operate with 64 bit wide or other sized operands. The packed word format 720 of this example is 128 bits long and contains eight packed word data elements. Each packed word contains sixteen bits of information. The packed doubleword format 730 of FIG. 7 is 128 bits long and contains four packed doubleword data elements. Each packed doubleword data element contains thirty two bits of information. A packed quadword is 128 bits long and contains two packed quad-word data elements.

FIG. 8A is a block diagram illustrating an in-order pipeline and a register renaming stage, out-of-order issue/execution pipeline according to at least one embodiment of the disclosure. FIG. 8B is a block diagram illustrating an in-order architecture core and a register renaming logic, out-of-order issue/execution logic to be included in a processor according to at least one embodiment of the disclosure. The solid lined boxes in FIG. 8A illustrate the in-order pipeline, while the dashed lined boxes illustrates the register renaming, out-of-order issue/execution pipeline. Similarly, the solid lined boxes in FIG. 8B illustrate the in-order architecture logic, while the dashed lined boxes illustrates the register renaming logic and out-of-order issue/execution logic.

In FIG. 8A, a processor pipeline 800 includes a fetch stage 802, a length decode stage 804, a decode stage 806, an allocation stage 808, a renaming stage 810, a scheduling (also known as a dispatch or issue) stage 812, a register read/memory read stage 814, an execute stage 816, a write back/memory write stage 818, an exception handling stage 822, and a commit stage 824.

In FIG. 8B, arrows denote a coupling between two or more units and the direction of the arrow indicates a direction of data flow between those units. FIG. 8B shows processor core 890 including a front end unit 830 coupled to an execution engine unit 850, and both are coupled to a memory unit 870.

The core 890 may be a reduced instruction set computing (RISC) core, a complex instruction set computing (CISC) core, a very long instruction word (VLIW) core, or a hybrid or alternative core type. As yet another option, the core 890 may be a special-purpose core, such as, for example, a network or communication core, compression engine, graphics core, or the like.

The front end unit 830 includes a branch prediction unit 832 coupled to an instruction cache unit 834, which is coupled to an instruction translation lookaside buffer (TLB) 836, which is coupled to an instruction fetch unit 838, which is coupled to a decode unit 840. The decode unit or decoder may decode instructions, and generate as an output one or more micro-operations, micro-code entry points, microinstructions, other instructions, or other control signals, which are decoded from, or which otherwise reflect, or are derived from, the original instructions. The decoder may be implemented using various different mechanisms. Examples of suitable mechanisms include, but are not limited to, look-up tables, hardware implementations, programmable logic arrays (PLAs), microcode read only memories (ROMs), etc. The instruction cache unit 834 is further coupled to a level 2 (L2) cache unit 876 in the memory unit 870. The decode unit 840 is coupled to a rename/allocator unit 852 in the execution engine unit 850.

The execution engine unit 850 includes the rename/allocator unit 852 coupled to a retirement unit 854 and a set of one or more scheduler unit(s) 856. The scheduler unit(s) 856 represents any number of different schedulers, including reservations stations, central instruction window, etc. The scheduler unit(s) 856 is coupled to the physical register file(s) unit(s) 858. Each of the physical register file(s) units 858 represents one or more physical register files, different ones of which store one or more different data types, such as scalar integer, scalar floating point, packed integer, packed floating point, vector integer, vector floating point, status (e.g., an instruction pointer that is the address of the next instruction to be executed), etc. The physical register file(s) unit(s) 858 is overlapped by the retirement unit 854 to illustrate various ways in which register renaming and out-of-order execution may be implemented (e.g., using a reorder buffer(s) and a retirement register file(s), using a future file(s), a history buffer(s), and a retirement register file(s); using a register maps and a pool of registers; etc.). Generally, the architectural registers are visible from the outside of the processor or from a programmer's perspective. The registers are not limited to any known particular type of circuit. Various different types of registers are suitable as long as they are capable of storing and providing data as described herein. Examples of suitable registers include, but are not limited to, dedicated physical registers, dynamically allocated physical registers using register renaming, combinations of dedicated and dynamically allocated physical registers, etc. The retirement unit 854 and the physical register file(s) unit(s) 858 are coupled to the execution cluster(s) 860. The execution cluster(s) 860 includes a set of one or more execution units 862 and a set of one or more memory access units 864. The execution units 862 may perform various operations (e.g., shifts, addition, subtraction, multiplication) and on various types of data (e.g., scalar floating point, packed integer, packed floating point, vector integer, vector floating point). While some embodiments may include a number of execution units dedicated to specific functions or sets of functions, other embodiments may include one execution unit or multiple execution units that all perform all functions. The scheduler unit(s) 856, physical register file(s) unit(s) 858, and execution cluster(s) 860 are shown as being possibly plural because certain embodiments create separate pipelines for certain types of data/operations (e.g., a scalar integer pipeline, a scalar floating point/packed integer/packed floating point/vector integer/vector floating point pipeline, and/or a memory access pipeline that each have their own scheduler unit, physical register file(s) unit, and/or execution cluster—and in the case of a separate memory access pipeline, certain embodiments are implemented in which the execution cluster of this pipeline has the memory access unit(s) 864). It should also be understood that where separate pipelines are used, one or more of these pipelines may be out-of-order issue/execution and the rest in-order.

The set of memory access units 864 is coupled to the memory unit 870, which includes a data TLB unit 872 coupled to a data cache unit 874 coupled to a level 2 (L2) cache unit 876. In one exemplary embodiment, the memory access units 864 may include a load unit, a store address unit, and a store data unit, each of which is coupled to the data TLB unit 872 in the memory unit 870. The L2 cache unit 876 is coupled to one or more other levels of cache and eventually to a main memory.

By way of example, the register renaming, out-of-order issue/execution core architecture may implement the pipeline 800 as follows: 1) the instruction fetch 838 performs the fetch and length decoding stages 802 and 804; 2) the decode unit 840 performs the decode stage 806; 3) the rename/allocator unit 852 performs the allocation stage 808 and renaming stage 810; 4) the scheduler unit(s) 856 performs the schedule stage 812; 5) the physical register file(s) unit(s) 858 and the memory unit 870 perform the register read/memory read stage 814; the execution cluster 880 perform the execute stage 816; 6) the memory unit 870 and the physical register file(s) unit(s) 858 perform the write back/memory write stage 818; 7) various units may be involved in the exception handling stage 822; and 8) the retirement unit 854 and the physical register file(s) unit(s) 858 perform the commit stage 824.

The core 890 may support one or more instructions sets (e.g., the x86 instruction set (with some extensions that have been added with newer versions); the MIPS instruction set of MIPS Technologies of Sunnyvale, Calif.; the ARM instruction set (with additional extensions such as NEON) of ARM Holdings of Sunnyvale, Calif.).

While register renaming is described in the context of out-of-order execution, it should be understood that register renaming may be used in an in-order architecture. While the illustrated embodiment of the processor also includes a separate instruction and data cache units 834/874 and a shared L2 cache unit 876, alternative embodiments may have a single internal cache for both instructions and data, such as, for example, a Level 1 (L1) internal cache, or multiple levels of internal cache. In some embodiments, the system may include a combination of an internal cache and an external cache that is external to the core and/or the processor. Alternatively, all of the cache may be external to the core and/or the processor.

Figure 9:
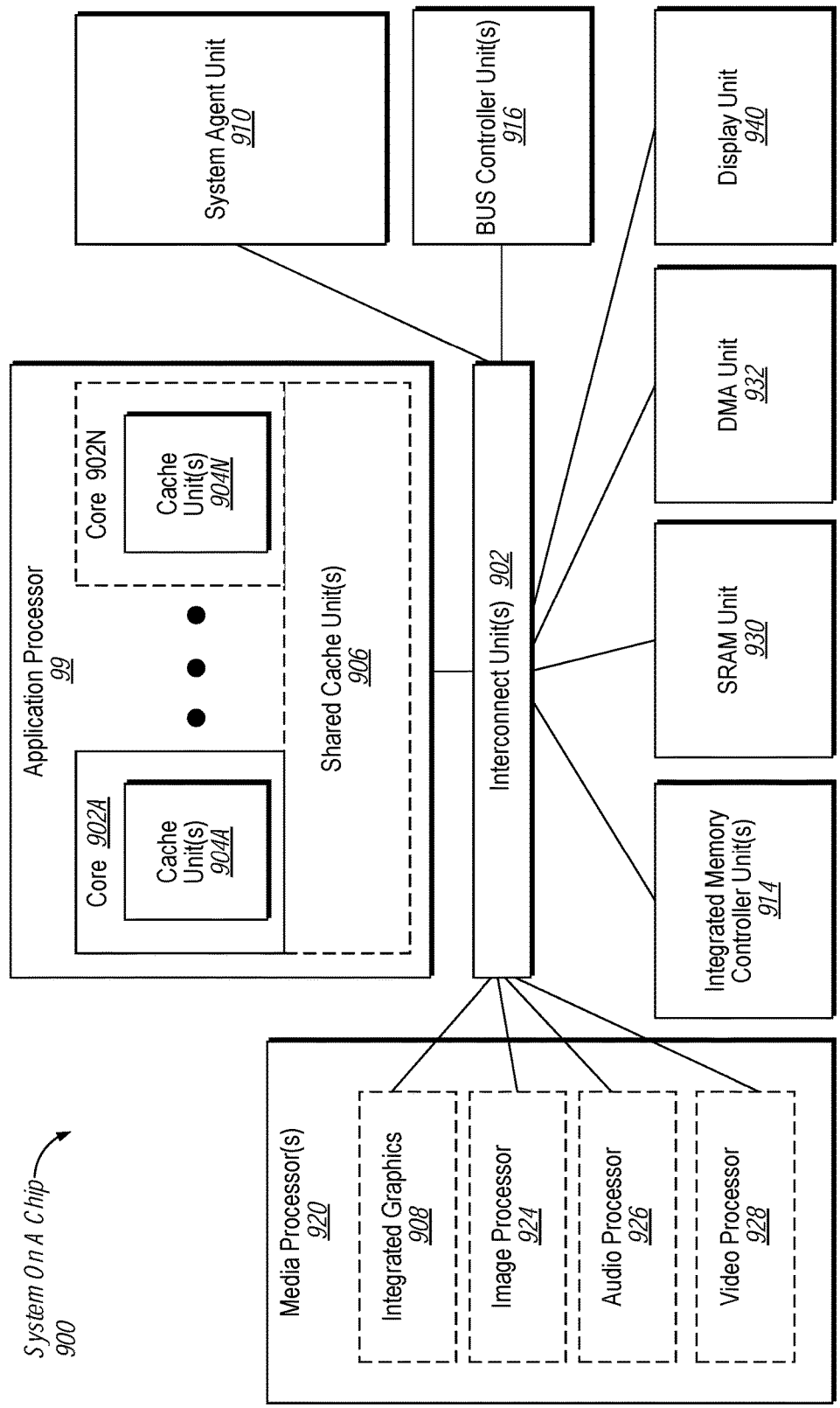
FIG. 9 is a block diagram of a system-on-a-chip according to embodiments.

Referring now to FIG. 9, shown is a block diagram of a SoC 900 in accordance with an embodiment of the present disclosure. Similar elements in FIG. 9 bear like reference numerals. Also, dashed lined boxes are features on more advanced SoCs. In FIG. 9, an interconnect unit(s) 902 is coupled to: an application processor 910 which includes a set of one or more cores 902A-N and shared cache unit(s) 906; a system agent unit 910; a bus controller unit(s) 916; an integrated memory controller unit(s) 914; a set or one or more media processors 920 which may include integrated graphics logic 908, an image processor 924 for providing still and/or video camera functionality, an audio processor 926 for providing hardware audio acceleration, and a video processor 928 for providing video encode/decode acceleration; an static random access memory (SRAM) unit 930; a direct memory access (DMA) unit 932; and a display unit 940 for coupling to one or more external displays.

Figure 10:
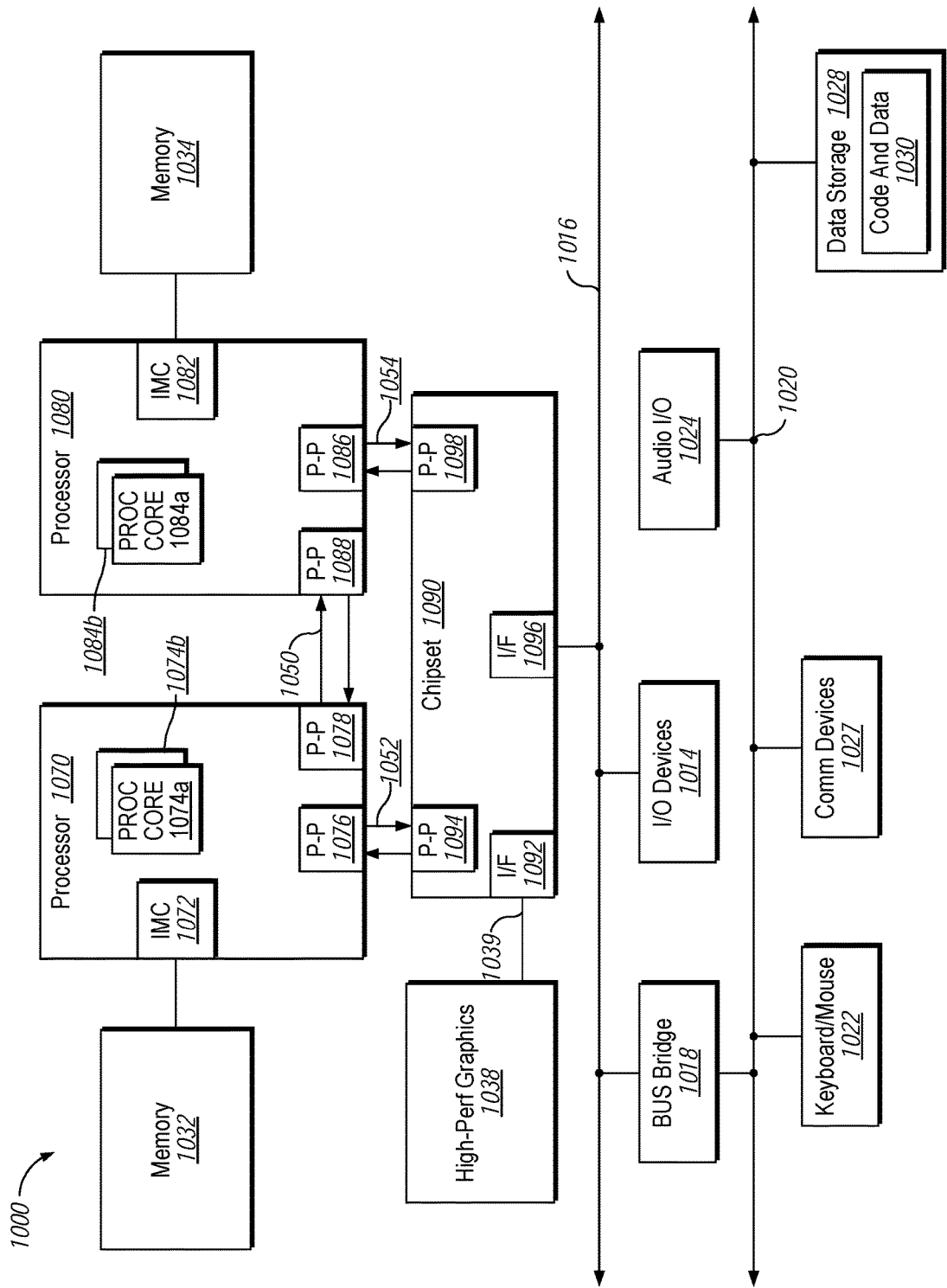
FIG. 10 is a block diagram of a computer system according to embodiments.

Embodiments may be implemented in many different system types. Referring now to FIG. 10, shown is a block diagram of a multiprocessor system 1000 in accordance with an implementation. As shown in FIG. 10, multiprocessor system 1000 is a point-to-point interconnect system, and includes a first processor 1070 and a second processor 1080 coupled via a point-to-point interconnect 1050. As shown in FIG. 10, each of processors 1070 and 1080 may be multicore processors, including first and second processor cores (i.e., processor cores 1074*a* and 1074*b* and processor cores 1084*a* and 1084*b*), although potentially many more cores may be present in the processors. The processors each may include hybrid write mode logics in accordance with an embodiment of the present.

While shown with two processors 1070, 1080, it is to be understood that the scope of the present disclosure is not so limited. In other implementations, one or more additional processors may be present in a given processor.

Processors 1070 and 1080 are shown including integrated memory controller units 8102 and 8102, respectively. Processor 1070 also includes as part of its bus controller units point-to-point (P-P) interfaces 1076 and 1078; similarly, second processor 1080 includes P-P interfaces 1086 and 1088. Processors 1070, 1080 may exchange information via a point-to-point (P-P) interface 1050 using P-P interface circuits 1078, 1088. As shown in FIG. 10, IMCs 1072 and 1082 couple the processors to respective memories, namely a memory 1032 and a memory 1034, which may be portions of main memory locally attached to the respective processors.

Processors 1070, 1080 may each exchange information with a chipset 1090 via individual P-P interfaces 1052, 1054 using point to point interface circuits 1076, 1094, 1086, 1098. Chipset 1090 may also exchange information with a high-performance graphics circuit 1038 via a high-performance graphics interface 1039.

A shared cache (not shown) may be included in either processor or outside of both processors, yet connected with the processors via P-P interconnect, such that either or both processors' local cache information may be stored in the shared cache if a processor is placed into a low power mode.

Chipset 1090 may be coupled to a first bus 1016 via an interface 1096. In one embodiment, first bus 1016 may be a Peripheral Component Interconnect (PCI) bus, or a bus such as a PCI Express bus or another third generation I/O interconnect bus, although the scope of the present disclosure is not so limited.

As shown in FIG. 10, various I/O devices 1014 may be coupled to first bus 1016, along with a bus bridge 1018 which couples first bus 1016 to a second bus 1020. In one embodiment, second bus 1020 may be a low pin count (LPC) bus. Various devices may be coupled to second bus 1020 including, for example, a keyboard and/or mouse 1022, communication devices 1027 and a storage unit 1028 such as a disk drive or other mass storage device which may include instructions/code and data 1030, in one embodiment. Further, an audio I/O 1024 may be coupled to second bus 1020. Note that other architectures are possible. For example, instead of the point-to-point architecture of FIG. 10, a system may implement a multi-drop bus or other such architecture.

Figure 11:
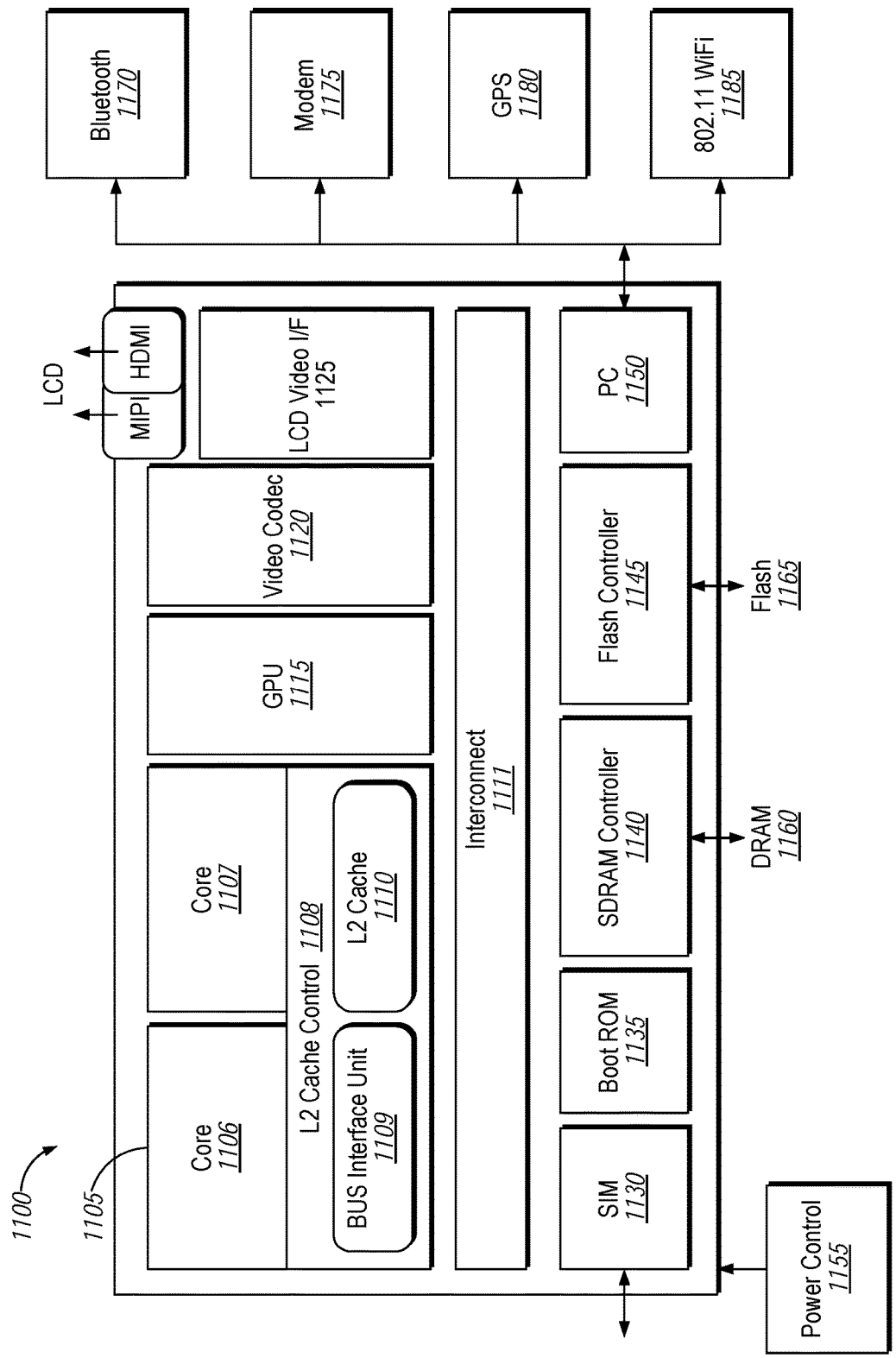
FIG. 11 illustrates another implementation of a block diagram for a computing system according to embodiments.
Figure 12:
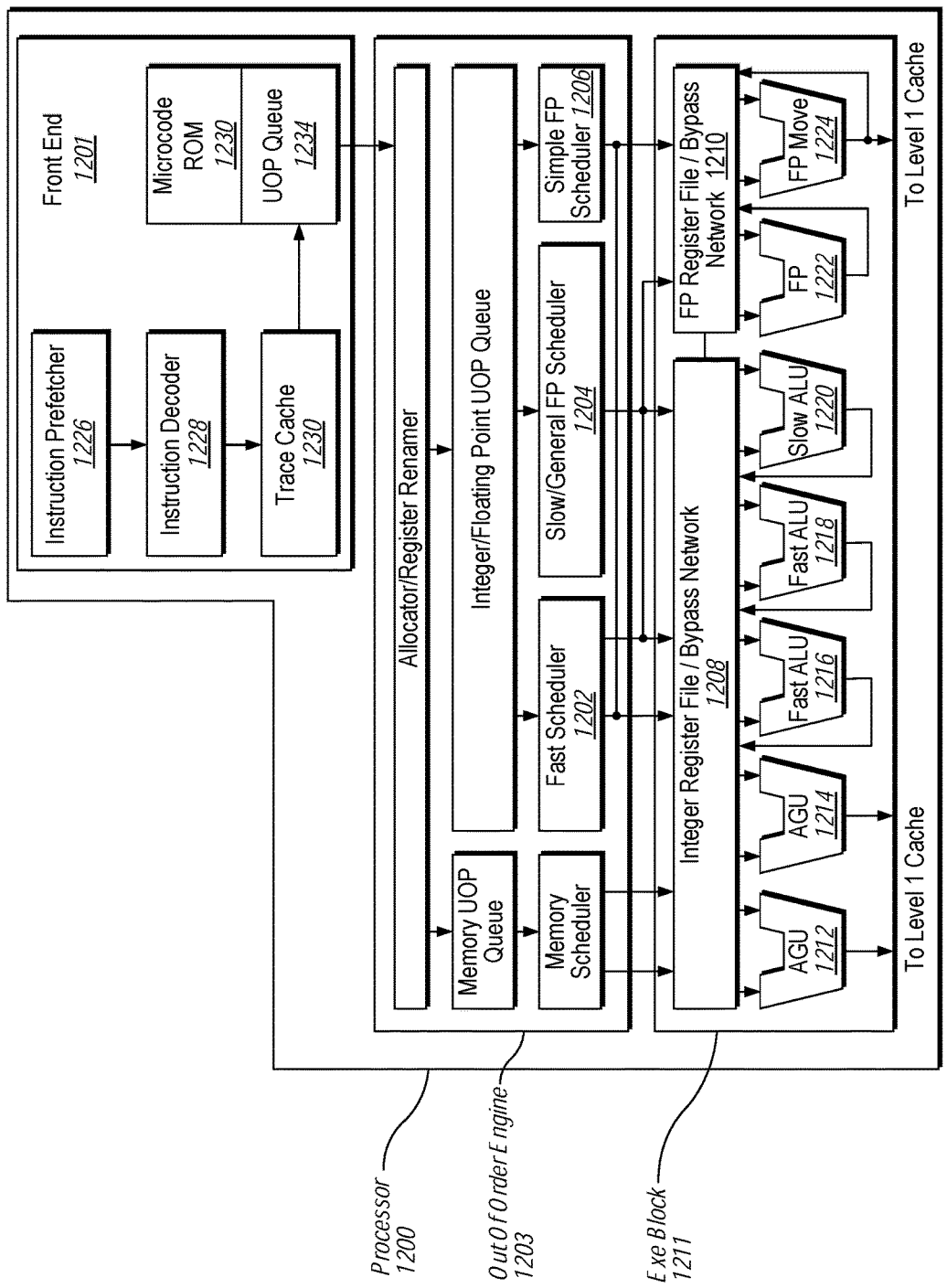
FIG. 12 is a block diagram of a processor according to embodiments.

Turning next to FIG. 11, an embodiment of a system on-chip (SOC) design in accordance with embodiments of the disclosure is depicted. As an illustrative example, SOC 1100 is included in user equipment (UE). In one embodiment, UE refers to any device to be used by an end-user to communicate, such as a hand-held phone, smartphone, tablet, ultra-thin notebook, notebook with broadband adapter, or any other similar communication device. A UE may connect to a base station or node, which can correspond in nature to a mobile station (MS) in a GSM network.

Here, SOC 1100 includes 2 cores—1106 and 1107. Similar to the discussion above, cores 1106 and 1107 may conform to an Instruction Set Architecture, such as a processor having the Intel® Architecture Core™, an Advanced Micro Devices, Inc. (AMD) processor, a MIPS-based processor, an ARM-based processor design, or a customer thereof, as well as their licensees or adopters. Cores 1106 and 1107 are coupled to cache control 1108 that is associated with bus interface unit 1109 and L2 cache 1110 to communicate with other parts of system 1100. Interconnect 1111 includes an on-chip interconnect, such as an IOSF, AMBA, or other interconnects discussed above, which can implement one or more aspects of the described disclosure.

Interconnect 1111 provides communication channels to the other components, such as a Subscriber Identity Module (SIM) 1130 to interface with a SIM card, a boot rom 1135 to hold boot code for execution by cores 1106 and 1107 to initialize and boot SOC 1100, a SDRAM controller 1140 to interface with external memory (e.g. DRAM 1160), a flash controller 1145 to interface with persistent or non-volatile memory (e.g. Flash 1165), a peripheral control 1150 (e.g. Serial Peripheral Interface) to interface with peripherals, video codecs 1120 and Video interface 1125 to display and receive input (e.g. touch enabled input), GPU 1115 to perform graphics related computations, etc. Any of these interfaces may incorporate aspects of the embodiments described herein.

In addition, the system illustrates peripherals for communication, such as a Bluetooth module 1170, modem 1175 (e.g., 3G, 4G, Long Term Evolution (LTE), LTE-Advanced, etc.), GPS 1180, Wi-Fi 1185, Zigbee (not shown), and Z-Wave (not shown). Note as stated above, a UE includes a radio for communication. As a result, these peripheral communication modules may not all be included. However, in a UE some form of a radio for external communication should be included.

FIG. 7 is a block diagram of the micro-architecture for a processor 1200 that includes logic circuits to perform instructions in accordance with one embodiment of the present disclosure. In some embodiments, an instruction in accordance with one embodiment can be implemented to operate on data elements having sizes of byte, word, double-word, quadword, etc., as well as datatypes, such as single and double precision integer and floating point datatypes. In one embodiment the in-order front end 1201 is the part of the processor 1200 that fetches instructions to be executed and prepares them to be used later in the processor pipeline. The front end 1201 may include several units. In one embodiment, the instruction prefetcher 1226 fetches instructions from memory and feeds them to an instruction decoder 1228 which in turn decodes or interprets them. For example, in one embodiment, the decoder decodes a received instruction into one or more operations called "micro-instructions" or "micro-operations" (also called micro op or uops) that the machine can execute. In other embodiments, the decoder parses the instruction into an opcode and corresponding data and control fields that are used by the micro-architecture to perform operations in accordance with one embodiment. In one embodiment, the trace cache 1230 takes decoded uops and assembles them into program ordered sequences or traces in the uop queue 1234 for execution. When the trace cache 1230 encounters a complex instruction, the microcode ROM 1232 provides the uops needed to complete the operation.

Some instructions are converted into a single micro-op, whereas others need several micro-ops to complete the full operation. In one embodiment, if more than four micro-ops are needed to complete an instruction, the decoder 1228 accesses the microcode ROM 1232 to do the instruction. For one embodiment, an instruction can be decoded into a small number of micro ops for processing at the instruction decoder 1228. In another embodiment, an instruction can be stored within the microcode ROM 1232 should a number of micro-ops be needed to accomplish the operation. The trace cache 1230 refers to an entry point programmable logic array (PLA) to determine a correct micro-instruction pointer for reading the micro-code sequences to complete one or more instructions in accordance with one embodiment from the micro-code ROM 1232. After the microcode ROM 1232 finishes sequencing micro-ops for an instruction, the front end 1201 of the machine resumes fetching micro-ops from the trace cache 1230.

The out-of-order execution engine 1203 is where the instructions are prepared for execution. The out-of-order execution logic has a number of buffers to smooth out and re-order the flow of instructions to optimize performance as they go down the pipeline and get scheduled for execution. The allocator logic allocates the machine buffers and resources that each uop needs in order to execute. The register renaming logic renames logic registers onto entries in a register file. The allocator also allocates an entry for each uop in one of the two uop queues, one for memory operations and one for non-memory operations, in front of the instruction schedulers: memory scheduler, fast scheduler 1202, slow/general floating point scheduler 1204, and simple floating point scheduler 1206. The uop schedulers 1202, 1204, 1206 determine when a uop is ready to execute based on the readiness of their dependent input register operand sources and the availability of the execution resources the uops need to complete their operation. The fast scheduler 1202 of one embodiment can schedule on each half of the main clock cycle while the other schedulers can schedule once per main processor clock cycle. The schedulers arbitrate for the dispatch ports to schedule uops for execution.

Register files 1208, 1210 sit between the schedulers 1202, 1204, 1206, and the execution units 1212, 1214, 1216, 1218, 1220, 1222, 1224 in the execution block 1211. There is a separate register file 1208, 1210 for integer and floating point operations, respectively. Each register file 1208, 1210, of one embodiment also includes a bypass network that can bypass or forward just completed results that have not yet been written into the register file to new dependent uops. The integer register file 1208 and the floating point register file 1210 are also capable of communicating data with the other. For one embodiment, the integer register file 1208 is split into two separate register files, one register file for the low order 32 bits of data and a second register file for the high order 32 bits of data. The floating point register file 1210 of one embodiment has 128 bit wide entries because floating point instructions typically have operands from 64 to 128 bits in width.

The execution block 1211 contains the execution units 1212, 1214, 1216, 1218, 1220, 1222, 1224, where the instructions are actually executed. This section includes the register files 1208, 1210, that store the integer and floating point data operand values that the micro-instructions need to execute. The processor 1200 of one embodiment is comprised of a number of execution units: address generation unit (AGU) 1212, AGU 1214, fast ALU 1216, fast ALU 1218, slow ALU 1220, floating point ALU 1222, floating point move unit 1224. For one embodiment, the floating point execution blocks 1222, 1224, execute floating point, MMX, SIMD, and SSE, or other operations. The floating point ALU 1222 of one embodiment includes a 64 bit by 64 bit floating point divider to execute divide, square root, and remainder micro-ops. For embodiments of the present disclosure, instructions involving a floating point value may be handled with the floating point hardware. In one embodiment, the ALU operations go to the high-speed ALU execution units 1216, 1218. The fast ALUs 1216, 1218, of one embodiment can execute fast operations with an effective latency of half a clock cycle. For one embodiment, most complex integer operations go to the slow ALU 1220 as the slow ALU 1220 includes integer execution hardware for long latency type of operations, such as a multiplier, shifts, flag logic, and branch processing. Memory load/store operations are executed by the AGUs 1212, 1214. For one embodiment, the integer ALUs 1216, 1218, 1220 are described in the context of performing integer operations on 64 bit data operands. In alternative embodiments, the ALUs 1216, 1218, 1220 can be implemented to support a variety of data bits including 16, 32, 128, 756, etc. Similarly, the floating point units 1222, 1224 can be implemented to support a range of operands having bits of various widths. For one embodiment, the floating point units 1222, 1224 can operate on 128 bits wide packed data operands in conjunction with SIMD and multimedia instructions.

In one embodiment, the uops schedulers 1202, 1204, 1206 dispatch dependent operations before the parent load has finished executing. As uops are speculatively scheduled and executed in processor 1200, the processor 1200 also includes logic to handle memory misses. If a data load misses in the data cache, there can be dependent operations in flight in the pipeline that have left the scheduler with temporarily incorrect data. A replay mechanism tracks and re-executes instructions that use incorrect data. The dependent operations should be replayed and the independent ones are allowed to complete. The schedulers and replay mechanism of one embodiment of a processor are also designed to catch instruction sequences for text string comparison operations.

The term "registers" may refer to the on-board processor storage locations that are used as part of instructions to identify operands. In other words, registers may be those that are usable from the outside of the processor (from a programmer's perspective). However, the registers of an embodiment should not be limited in meaning to a particular type of circuit. Rather, a register of an embodiment is capable of storing and providing data, and performing the functions described herein. The registers described herein can be implemented by circuitry within a processor using any number of different techniques, such as dedicated physical registers, dynamically allocated physical registers using register renaming, combinations of dedicated and dynamically allocated physical registers, etc. In one embodiment, integer registers store thirty-two bit integer data. A register file of one embodiment also contains eight multimedia SIMD registers for packed data. For the discussions below, the registers are understood to be data registers designed to hold packed data, such as 64 bits wide MMX registers (also referred to as 'mm' registers in some instances) in microprocessors enabled with the MMX™ technology from Intel Corporation of Santa Clara, Calif. These MMX registers, available in both integer and floating point forms, can operate with packed data elements that accompany SIMD and SSE instructions. Similarly, 128 bits wide XMIM registers relating to SSE2, SSE3, SSE4, or beyond (referred to generically as "SSEx") technology can also be used to hold such packed data operands. In one embodiment, in storing packed data and integer data, the registers do not need to differentiate between the two data types. In one embodiment, integer and floating point are either contained in the same register file or different register files. Furthermore, in one embodiment, floating point and integer data may be stored in different registers or the same registers.

Figure 13:
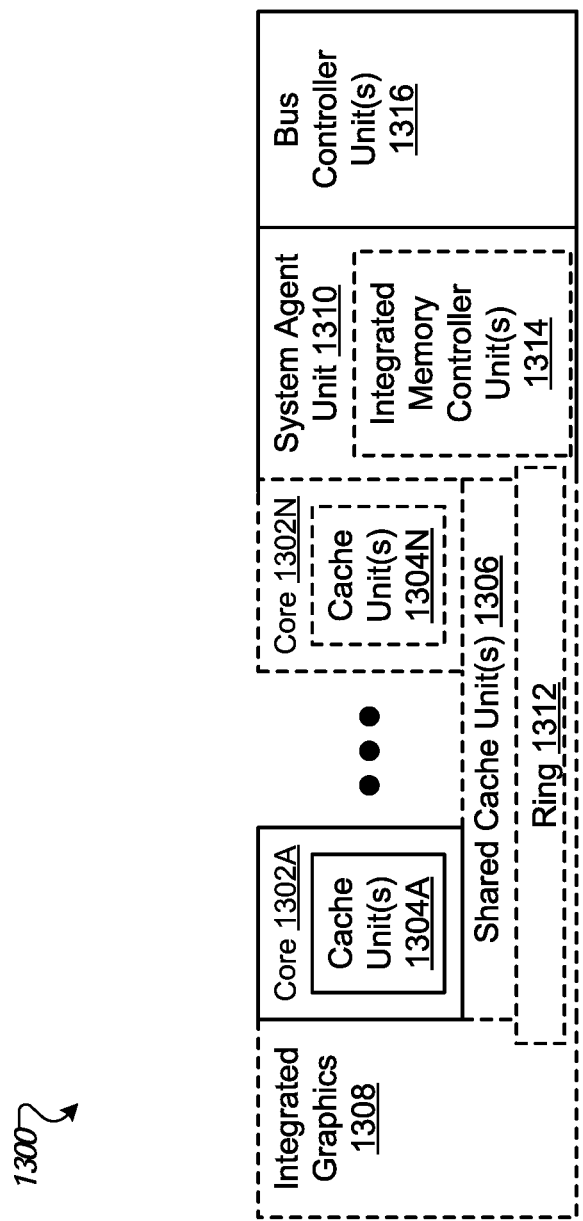
FIG. 13 is a block diagram of a processor according to embodiments.

FIG. 13 is a block diagram of a single core processor and a multicore processor 1300 with integrated memory controller and graphics according to embodiments of the disclosure. The solid lined boxes in FIG. 13 illustrate a processor 1300 with a single core 1302A, a system agent 1310, a set of one or more bus controller units 1316, while the addition of the dashed lined boxes illustrates an alternative processor 1300 with multiple cores 1302A-N, a set of one or more integrated memory controller unit(s) 1314 in the system agent unit 1310, and an integrated graphics logic 1308.

The memory hierarchy includes one or more levels of cache within the cores, a set or one or more shared cache units 1306, and external memory (not shown) coupled to the set of integrated memory controller units 1314. The set of shared cache units 1306 may include one or more mid-level caches, such as level 2 (L2), level 3 (L3), level 4 (L4), or other levels of cache, a last level cache (LLC), and/or combinations thereof. While in one embodiment a ring based interconnect unit 1312 interconnects the integrated graphics logic 1308, the set of shared cache units 1306, and the system agent unit 1310, alternative embodiments may use any number of well-known techniques for interconnecting such units.

In some implementations, one or more of the cores 1302A-N are capable of multi-threading.

The system agent 1310 includes those components coordinating and operating cores 1302A-N. The system agent unit 1310 may include for example a power control unit (PCU) and a display unit. The PCU may be or include logic and components needed for regulating the power state of the cores 1302A-N and the integrated graphics logic 1308. The display unit is for driving one or more externally connected displays.

The cores 1302A-N may be homogenous or heterogeneous in terms of architecture and/or instruction set. For example, some of the cores 1302A-N may be in order while others are out-of-order. As another example, two or more of the cores 1302A-N may be capable of execution the same instruction set, while others may be capable of executing a subset of that instruction set or a different instruction set. As a further example, the cores can be different architecture.

The processor may include one or more different general-purpose processors, such as a Core™ i3, i5, i7, 2 Duo and Quad, Xeon™, Itanium™, Atom™, XScale™ or StrongARM™ processor, which are available from Intel Corporation, of Santa Clara, Calif. For example, one core can be a Core i7™ core while another core of the processor can be an Atom™ core. Alternatively, the processor may be from another company, such as ARM Holdings, Ltd, MIPS, etc. The processor may be a special-purpose processor, such as, for example, a network or communication processor, compression engine, graphics processor, co-processor, embedded processor, or the like. The processor may be implemented on one or more chips. The processor 800 may be a part of and/or may be implemented on one or more substrates using any of a number of process technologies, such as, for example, BiCMOS, CMOS, or NMOS.

While the present disclosure has been described with respect to a limited number of embodiments, those skilled in the art will appreciate numerous modifications and variations therefrom. It is intended that the appended claims cover all such modifications and variations as fall within the true spirit and scope of this present disclosure.

In the description herein, numerous specific details are set forth, such as examples of specific types of processors and system configurations, specific hardware structures, specific architectural and micro architectural details, specific register configurations, specific instruction types, specific system components, specific measurements/heights, specific processor pipeline stages and operation etc. in order to provide a thorough understanding of the present disclosure. It will be apparent, however, to one skilled in the art that these specific details need not be employed to practice the present disclosure. In other instances, well known components or methods, such as specific and alternative processor architectures, specific logic circuits/code for described algorithms, specific firmware code, specific interconnect operation, specific logic configurations, specific manufacturing techniques and materials, specific compiler implementations, specific expression of algorithms in code, specific power down and gating techniques/logic and other specific operational details of computer system have not been described in detail in order to avoid unnecessarily obscuring the present disclosure.

The embodiments are described with reference to hybrid-threading in specific integrated circuits, such as in computing platforms or microprocessors. The embodiments may also be applicable to other types of integrated circuits and programmable logic devices. For example, the disclosed embodiments are not limited to desktop computer systems or portable computers, such as the Intel® Ultrabooks™ computers. And may be also used in other devices, such as handheld devices, tablets, other thin notebooks, systems on a chip (SOC) devices, and embedded applications. Some examples of handheld devices include cellular phones, Internet protocol devices, digital cameras, personal digital assistants (PDAs), and handheld PCs. Embedded applications typically include a microcontroller, a digital signal processor (DSP), a system on a chip, network computers (NetPC), set-top boxes, network hubs, wide area network (WAN) switches, or any other system that can perform the functions and operations taught below. It is described that the system can be any kind of computer or embedded system. The disclosed embodiments may especially be used for low-end devices, like wearable devices (e.g., watches), electronic implants, sensory and control infrastructure devices, controllers, supervisory control and data acquisition (SCADA) systems, or the like. Moreover, the apparatuses, methods, and systems described herein are not limited to physical computing devices, but may also relate to software optimizations for energy conservation and efficiency. As will become readily apparent in the description below, the embodiments of methods, apparatuses, and systems described herein (whether in reference to hardware, firmware, software, or a combination thereof) are vital to a 'green technology' future balanced with performance considerations.

Although the embodiments herein are described with reference to a processor, other embodiments are applicable to other types of integrated circuits and logic devices. Similar techniques and teachings of embodiments of the present disclosure can be applied to other types of circuits or semiconductor devices that can benefit from higher pipeline throughput and improved performance. The teachings of embodiments of the present disclosure are applicable to any processor or machine that performs data manipulations. However, the present disclosure is not limited to processors or machines that perform 512 bit, 256 bit, 128 bit, 64 bit, 32 bit, or 16 bit data operations and can be applied to any processor and machine in which manipulation or management of data is performed. In addition, the description herein provides examples, and the accompanying drawings show various examples for the purposes of illustration. However, these examples should not be construed in a limiting sense as they are merely intended to provide examples of embodiments of the present disclosure rather than to provide an exhaustive list of all possible implementations of embodiments of the present disclosure.

Although the below examples describe instruction handling and distribution in the context of execution units and logic circuits, other embodiments of the present disclosure can be accomplished by way of a data or instructions stored on a machine-readable, tangible medium, which when performed by a machine cause the machine to perform functions consistent with at least one embodiment of the disclosure. In one embodiment, functions associated with embodiments of the present disclosure are embodied in machine-executable instructions. The instructions can be used to cause a general-purpose or special-purpose processor that is programmed with the instructions to perform the steps of the present disclosure. Embodiments of the present disclosure may be provided as a computer program product or software which may include a machine or computer-readable medium having stored thereon instructions which may be used to program a computer (or other electronic devices) to perform one or more operations according to embodiments of the present disclosure. Alternatively, operations of embodiments of the present disclosure might be performed by specific hardware components that contain fixed-function logic for performing the operations, or by any combination of programmed computer components and fixed-function hardware components.

Instructions used to program logic to perform embodiments of the disclosure can be stored within a memory in the system, such as DRAM, cache, flash memory, or other storage. Furthermore, the instructions can be distributed via a network or by way of other computer readable media. Thus a machine-readable medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage used in the transmission of information over the Internet via electrical, optical, acoustical or other forms of propagated signals (e.g., carrier waves, infrared signals, digital signals, etc.). Accordingly, the computer-readable medium includes any type of tangible machine-readable medium suitable for storing or transmitting electronic instructions or information in a form readable by a machine (e.g., a computer).

A design may go through various stages, from creation to simulation to fabrication. Data representing a design may represent the design in a number of manners. First, as is useful in simulations, the hardware may be represented using a hardware description language or another functional description language. Additionally, a circuit level model with logic and/or transistor gates may be produced at some stages of the design process. Furthermore, most designs, at some stage, reach a level of data representing the physical placement of various devices in the hardware model. In the case where conventional semiconductor fabrication techniques are used, the data representing the hardware model may be the data specifying the presence or absence of various features on different mask layers for masks used to produce the integrated circuit. In any representation of the design, the data may be stored in any form of a machine readable medium. A memory or a magnetic or optical storage such as a disc may be the machine readable medium to store information transmitted via optical or electrical wave modulated or otherwise generated to transmit such information. When an electrical carrier wave indicating or carrying the code or design is transmitted, to the extent that copying, buffering, or re-transmission of the electrical signal is performed, a new copy is made. Thus, a communication provider or a network provider may store on a tangible, machine-readable medium, at least temporarily, an article, such as information encoded into a carrier wave, embodying techniques of embodiments of the present disclosure.

A module as used herein refers to any combination of hardware, software, and/or firmware. As an example, a module includes hardware, such as a micro-controller, associated with a non-transitory medium to store code adapted to be executed by the micro-controller. Therefore, reference to a module, in one embodiment, refers to the hardware, which is specifically configured to recognize and/or execute the code to be held on a non-transitory medium. Furthermore, in another embodiment, use of a module refers to the non-transitory medium including the code, which is specifically adapted to be executed by the microcontroller to perform predetermined operations. And as can be inferred, in yet another embodiment, the term module (in this example) may refer to the combination of the microcontroller and the non-transitory medium. Often module boundaries that are illustrated as separate commonly vary and potentially overlap. For example, a first and a second module may share hardware, software, firmware, or a combination thereof, while potentially retaining some independent hardware, software, or firmware. In one embodiment, use of the term logic includes hardware, such as transistors, registers, or other hardware, such as programmable logic devices.

Use of the phrase 'configured to,' in one embodiment, refers to arranging, putting together, manufacturing, offering to sell, importing and/or designing an apparatus, hardware, logic, or element to perform a designated or determined task. In this example, an apparatus or element thereof that is not operating is still 'configured to' perform a designated task if it is designed, coupled, and/or interconnected to perform said designated task. As a purely illustrative example, a logic gate may provide a 0 or a 1 during operation. But a logic gate 'configured to' provide an enable signal to a clock does not include every potential logic gate that may provide a 1 or 0. Instead, the logic gate is one coupled in some manner that during operation the 1 or 0 output is to enable the clock. Note once again that use of the term 'configured to' does not require operation, but instead focus on the latent state of an apparatus, hardware, and/or element, where in the latent state the apparatus, hardware, and/or element is designed to perform a particular task when the apparatus, hardware, and/or element is operating.

Furthermore, use of the phrases 'to,' 'capable of/to,' and or 'operable to,' in one embodiment, refers to some apparatus, logic, hardware, and/or element designed in such a way to enable use of the apparatus, logic, hardware, and/or element in a specified manner. Note as above that use of to, capable to, or operable to, in one embodiment, refers to the latent state of an apparatus, logic, hardware, and/or element, where the apparatus, logic, hardware, and/or element is not operating but is designed in such a manner to enable use of an apparatus in a specified manner.

A value, as used herein, includes any known representation of a number, a state, a logical state, or a binary logical state. Often, the use of logic levels, logic values, or logical values is also referred to as 1's and 0's, which simply represents binary logic states. For example, a 1 refers to a high logic level and 0 refers to a low logic level. In one embodiment, a storage cell, such as a transistor or flash cell, may be capable of holding a single logical value or multiple logical values. However, other representations of values in computer systems have been used. For example the decimal number ten may also be represented as a binary value of 1010 and a hexadecimal letter A. Therefore, a value includes any representation of information capable of being held in a computer system.

Moreover, states may be represented by values or portions of values. As an example, a first value, such as a logical one, may represent a default or initial state, while a second value, such as a logical zero, may represent a non-default state. In addition, the terms reset and set, in one embodiment, refer to a default and an updated value or state, respectively. For example, a default value potentially includes a high logical value, i.e. reset, while an updated value potentially includes a low logical value, i.e. set. Note that any combination of values may be utilized to represent any number of states.

The following examples pertain to further embodiments.

Example 1 is an integrated circuit that includes a data storage structure operative to store a set of data and a first error correction code that corresponds to the set of data, where the set of data includes a plurality of data bits, where the first error correction code was generated using a generator matrix having a plurality of bit groups, each bit group that includes a unique combination of bit values, an error correction code generator operative to generate a second error correction code based on the generator matrix, a comparator operative to generate a comparison result of the first error correction code and the second error correction code, and a data corrector operative to correct two consecutive data bits of the set of data when the comparison result corresponds to a result of an exclusive-or (XOR) operation performed on two consecutive bit groups of the generator matrix.

In Example 2, the subject matter of Example 1, where each of the plurality of bit groups of the generator matrix corresponds to one of the plurality of data bits, where each bit group includes a plurality of positions, each position that includes either a first value or a second value.

In Example 3, the subject matter of any one of Examples 1-2, where each of the plurality of bit groups includes an odd number of second values, the odd number being greater than one.

In Example 4, the subject matter of any one of Examples 1-3, where the XOR operation performed on a first set of two consecutive bit groups of the plurality of bit groups of the generator matrix results in a first vector, and where the XOR operation performed on a second set of two consecutive bit groups of the plurality of bit groups of the generator matrix results in a second vector that is different than the first vector.

In Example 5, the subject matter of any one of Examples 1-4, where the XOR operation performed on any two consecutive bit groups of the plurality of bit groups of the generator matrix results in a first vector that includes a same number of values.

In Example 6, the subject matter of any one of Examples 1-5, where the XOR operation performed on any two non-consecutive bit groups of the plurality of bit groups of the generator matrix results in a second vector that includes a number of values that is different than the same number of values.

In Example 7, the subject matter of any one of Examples 1-6, where the data corrector includes error detection logic to determine that the two consecutive data bits of the set of data both comprise an error when the comparison result corresponds to an entry in a correlation table that is associated with the two consecutive data bits of the set of data.

Example 8 is a method that includes receiving a set of data and a first error correction code that corresponds to the set of data, where the set of data includes a plurality of data bits, where the first error correction code was generated using a generator matrix having a plurality of bit groups equal to a number of the plurality of data bits, each bit group that includes a unique combination of bit values, generating, by a processor, a second error correction code based on the generator matrix, generating, by the processor, a comparison result of the first error correction code and the second error correction code, and correcting two consecutive data bits of the set of data when the comparison result corresponds to a result of an exclusive-or (XOR) operation performed on two consecutive bit groups of the generator matrix.

In Example 9, the subject matter of Example 8, where each of the plurality of bit groups of the generator matrix corresponds to one of the plurality of data bits, where each bit group includes a plurality of positions, each position that includes either a first value or a second value.

In Example 10, the subject matter of any one of Examples 8-9, where each of the plurality of bit groups includes an odd number of second values, the odd number being greater than one.

In Example 11, the subject matter of any one of Examples 8-10, further including performing the XOR operation on a first set of two consecutive bit groups of the plurality of bit groups of the generator matrix to obtain a first vector, and performing the XOR operation on a second set of two consecutive bit groups of the plurality of bit groups of the generator matrix to obtain a second vector that is different than the first vector.

In Example 12, the subject matter of any one of Examples 8-11, further including performing the XOR operation on any two consecutive bit groups of the plurality of bit groups of the generator matrix to obtain a first vector that includes a predefined number of values.

In Example 13, the subject matter of any one of Examples 8-12, further including performing the XOR operation on any two non-consecutive bit groups of the plurality of bit groups of the generator matrix to obtain a second vector that includes a number of values that is different than the predefined number of values.

In Example 14, the subject matter of any one of Examples 8-13 where correcting two consecutive data bits of the set of data includes determining that the two consecutive data bits of the set of data both comprise an error when the comparison result corresponds to an entry in a correlation table that is associated with the two consecutive data bits of the set of data.

Example 15 is a non-transitory machine-readable storage medium including data that, when accessed by a processor, cause the processor to perform operations that include receiving a set of data and a first error correction code that corresponds to the set of data, where the set of data includes a plurality of data bits, where the first error correction code was generated using a generator matrix having a number of bit groups equal to the plurality of data bits, each bit group that includes a unique combination of bit values, generating, by a processor, a second error correction code based on the generator matrix, the second error correction code, generating, by the processor, a comparison result of the first error correction code and the second error correction code, and correcting two consecutive data bits of the set of data when the comparison result corresponds to a result of an exclusive-or (XOR) operation performed on two consecutive bit groups of the generator matrix.

In Example 16, the subject matter of Example 15, where each of the plurality of bit groups of the generator matrix corresponds to one of the plurality of data bits, where each bit group includes a plurality of positions, each position that includes either a first value or a second value.

In Example 17, the subject matter of any one of Examples 15-16, where each of the plurality of bit groups includes an odd number of second values, the odd number being greater than one.

In Example 18, the subject matter of any one of Examples 15-17, the operations further including: performing the XOR operation on a first set of two consecutive bit groups of the plurality of bit groups of the generator matrix to obtain a first vector, and performing the XOR operation on a second set of two consecutive bit groups of the plurality of bit groups of the generator matrix to obtain a second vector that is different than the first vector.

In Example 19, the subject matter of any one of Examples 15-18, the operations further including: performing the XOR operation on any two consecutive bit groups of the plurality of bit groups of the generator matrix to obtain in a first vector that includes a predefined number of values, and performing the XOR operation on any two non-consecutive bit groups of the plurality of bit groups of the generator matrix to obtain a second vector that includes a number of values that is different than the predefined number of values.

In Example 20, the subject matter of any one of Examples 15-19, where correcting two consecutive data bits of the set of data includes determining that the two consecutive data bits of the set of data both comprise an error when the comparison result corresponds to an entry in a correlation table that is associated with the two consecutive data bits of the set of data.

Example 21 is a machine-readable storage medium including data that, when accessed by a processor, cause the processor to perform operations that include receiving a set of data and a first error correction code that corresponds to the set of data, where the set of data includes a plurality of data bits, where the first error correction code was generated using a generator matrix having a number of bit groups equal to the plurality of data bits, each bit group that includes a unique combination of bit values, generating, by a processor, a second error correction code based on the generator matrix, the second error correction code, generating, by the processor, a comparison result of the first error correction code and the second error correction code, and correcting two consecutive data bits of the set of data when the comparison result corresponds to a result of an exclusive-or (XOR) operation performed on two consecutive bit groups of the generator matrix.

In Example 22, the subject matter of Example 20, where each of the plurality of bit groups of the generator matrix corresponds to one of the plurality of data bits, where each bit group includes a plurality of positions, each position that includes either a first value or a second value.

In Example 23, the subject matter of any one of Examples 20-22, where each of the plurality of bit groups includes an odd number of second values, the odd number being greater than one.

In Example 24, the subject matter of any one of Examples 20-23, the operations further including: performing the XOR operation on a first set of two consecutive bit groups of the plurality of bit groups of the generator matrix to obtain a first vector, and performing the XOR operation on a second set of two consecutive bit groups of the plurality of bit groups of the generator matrix to obtain a second vector that is different than the first vector.

In Example 25, the subject matter of any one of Examples 20-24, the operations further including: performing the XOR operation on any two consecutive bit groups of the plurality of bit groups of the generator matrix to obtain in a first vector that includes a predefined number of values, and performing the XOR operation on any two non-consecutive bit groups of the plurality of bit groups of the generator matrix to obtain a second vector that includes a number of values that is different than the predefined number of values.

In Example 26, the subject matter of any one of Examples 20-25, where correcting two consecutive data bits of the set of data includes determining that the two consecutive data bits of the set of data both comprise an error when the comparison result corresponds to an entry in a correlation table that is associated with the two consecutive data bits of the set of data.

Example 27 is an apparatus that includes means for receiving a set of data and a first error correction code that corresponds to the set of data, where the set of data includes a plurality of data bits, where the first error correction code was generated using a generator matrix having a number of bit groups equal to the plurality of data bits, each bit group that includes a unique combination of bit values, means for generating a second error correction code based on the generator matrix, the second error correction code, means for generating a comparison result of the first error correction code and the second error correction code, and means for correcting two consecutive data bits of the set of data when the comparison result corresponds to a result of an exclusive-or (XOR) operation performed on two consecutive bit groups of the generator matrix.

In Example 28, the subject matter of Example 27, where each of the plurality of bit groups of the generator matrix corresponds to one of the plurality of data bits, where each bit group includes a plurality of positions, each position that includes either a first value or a second value.

In Example 29, the subject matter of any one of Examples 27-28, where each of the plurality of bit groups includes an odd number of second values, the odd number being greater than one.

In Example 30, the subject matter of any one of Examples 27-29 further including means for performing the XOR operation on a first set of two consecutive bit groups of the plurality of bit groups of the generator matrix to obtain a first vector, and means for performing the XOR operation on a second set of two consecutive bit groups of the plurality of bit groups of the generator matrix to obtain a second vector that is different than the first vector.

In Example 31, the subject matter of any one of Examples 27-30 further including means for performing the XOR operation on any two consecutive bit groups of the plurality of bit groups of the generator matrix to obtain a first vector that includes a predefined number of values.

In Example 32, the subject matter of any one of Examples 27-31 further including means for performing the XOR operation on any two non-consecutive bit groups of the plurality of bit groups of the generator matrix to obtain a second vector that includes a number of values that is different than the predefined number of values.

In Example 33, the subject matter of any one of Examples 27-32, where the means for correcting two consecutive data bits of the set of data includes means for determining that the two consecutive data bits of the set of data both comprise an error when the comparison result corresponds to an entry in a correlation table that is associated with the two consecutive data bits of the set of data.

Example 34 is a machine readable medium including code, when executed, to cause a machine to perform any one of Examples 8 to 14.

Example 35 is an apparatus that includes means for performing of any one of Examples 8 to 14.

Example 36 is an apparatus that includes a processor configured to perform of any one of Examples 8 to 14.

Example 37 is a method as in Example 8 that includes at least one of performing the XOR operation on a first set of two consecutive bit groups of the plurality of bit groups of the generator matrix to obtain a first vector, performing the XOR operation on a second set of two consecutive bit groups of the plurality of bit groups of the generator matrix to obtain a second vector that is different than the first vector, performing the XOR operation on any two consecutive bit groups of the plurality of bit groups of the generator matrix to obtain a first vector that includes a predefined number of values, and/or performing the XOR operation on any two non-consecutive bit groups of the plurality of bit groups of the generator matrix to obtain a second vector that includes a number of values that is different than the predefined number of values.

Example 38 is machine-readable storage including machine-readable instructions, when executed, to implement a method or realize an apparatus as in any preceding Example.

Example 39 is a system that includes a peripheral device, a data storage structure operative to store a set of data and a first error correction code that corresponds to the set of data, where the set of data includes a plurality of data bits, where the first error correction code was generated using a generator matrix having a plurality of bit groups, each bit group that includes a unique combination of bit values, an error correction code generator operative to generate a second error correction code based on the generator matrix, a comparator operative to generate a comparison result of the first error correction code and the second error correction code, and a data corrector operative to correct two consecutive data bits of the set of data when the comparison result corresponds to a result of an exclusive-or (XOR) operation performed on two consecutive bit groups of the generator matrix.

Example 40 is a system that includes a data storage structure operative to store a set of data and a first error correction code that corresponds to the set of data, where the set of data includes a plurality of data bits, where the first error correction code was generated using a generator matrix having a plurality of bit groups, each bit group that includes a unique combination of bit values, an error correction code generator operative to generate a second error correction code based on the generator matrix, a comparator operative to generate a comparison result of the first error correction code and the second error correction code, and a data corrector operative to correct two consecutive data bits of the set of data when the comparison result corresponds to a result of an exclusive-or (XOR) operation performed on two consecutive bit groups of the generator matrix.

The embodiments of methods, hardware, software, firmware or code set forth above may be implemented via instructions or code stored on a machine-accessible, machine readable, computer accessible, or computer readable medium which are executable by a processing element. A non-transitory machine-accessible/readable medium includes any mechanism that provides (i.e., stores and/or transmits) information in a form readable by a machine, such as a computer or electronic system. For example, a non-transitory machine-accessible medium includes random-access memory (RAM), such as static RAM (SRAM) or dynamic RAM (DRAM); ROM; magnetic or optical storage medium; flash memory devices; electrical storage devices; optical storage devices; acoustical storage devices; other form of storage devices for holding information received from transitory (propagated) signals (e.g., carrier waves, infrared signals, digital signals); etc., which are to be distinguished from the non-transitory mediums that may receive information there from.

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the present specification, a detailed description has been given with reference to specific example embodiments. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense. Furthermore, the foregoing use of embodiment and other exemplarily language does not necessarily refer to the same embodiment or the same example, but may refer to different and distinct embodiments, as well as potentially the same embodiment.

Some portions of the detailed description are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared and otherwise manipulated. It has proven convenient at times, principally for reasons of common usage, to refer to these signals as bits, values, elements, symbols, characters, terms, numbers or the like. The blocks described herein can be hardware, software, firmware or a combination thereof.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "defining," "receiving," "determining," "issuing," "linking," "associating," "obtaining," "authenticating," "prohibiting," "executing," "requesting," "communicating," "monitoring," "calculating," or the like, refer to the actions and processes of a computing system, or similar electronic computing device, that manipulates and transforms data represented as physical (e.g., electronic) quantities within the computing system's registers and memories into other data similarly represented as physical quantities within the computing system memories or registers or other such information storage, transmission or display devices.

The words "example" or "exemplary" are used herein to mean serving as an example, instance or illustration. Any aspect or design described herein as "example' or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an embodiment" or "one embodiment" or "an implementation" or "one implementation" throughout is not intended to mean the same embodiment or implementation unless described as such. Also, the terms "first," "second," "third," "fourth," etc. as used herein are meant as labels to distinguish among different elements and may not necessarily have an ordinal meaning according to their numerical designation.

What is claimed is:

1. A user equipment (UE) comprising:
a peripheral device;
a memory device; and
a System on Chip (SoC) coupled to the peripheral device and the memory device, wherein the SoC comprises:
a data storage structure to store a set of data and a first error correction code that corresponds to the set of data, wherein the set of data comprises a plurality of data bits, wherein the first error correction code was generated using a generator matrix having a plurality of bit groups, each bit group comprising a unique combination of bit values;

a comparator to generate a comparison result of the first error correction code and a second error correction code, wherein the second error correction code is generated based on the generator matrix, wherein there are no errors in the set of data when the comparison result is equal to zero, wherein there is at least one error in the set of data when the comparison result is not equal to zero; and a data corrector to i) correct a single bit error of the set of data when the comparison result matches one of the unique combination of bit values of one of the plurality of bit groups in the generator matrix; and ii) correct two consecutive data bits of the set of data when the comparison result corresponds to a predefined number of values as a result of an exclusive-or (XOR) operation performed on two consecutive bit groups of the generator matrix.

2. The UE of claim 1, further comprising a radio coupled to the SoC.

3. The UE of claim 1, wherein the SoC comprises:
an interconnect;
a first core coupled to the interconnect; and
a second core coupled to the interconnect.

4. The UE of claim 3, wherein the first core is a processor core and the second core is a graphics core.

5. The UE of claim 1, wherein the SoC comprises a plurality of functional units, wherein the plurality of functional units comprises at least two of a processor core, a graphics core, a voltage regulator, an input/output (I/O) interface, a memory controller, a network controller, or a fabric controller.

6. An apparatus comprising:
means for receiving a set of data and a first error correction code that corresponds to the set of data, wherein the set of data comprises a plurality of data bits, wherein the first error correction code was generated using a generator matrix having a number of bit groups equal to the plurality of data bits, each of the bit groups comprising a unique combination of bit values;
means for generating a comparison result of the first error correction code and a second error correction code, wherein the second error correction code is generated based on the generator matrix, wherein there are no errors in the set of data when the comparison result is equal to zero, wherein there is at least one error in the set of data when the comparison result is not equal to zero;
means for correcting a single bit error of the set of data when the comparison result matches one of the unique combination of bit values of one of the bit groups in the generator matrix; and
means for correcting two consecutive data bits of the set of data when the comparison result corresponds to a predefined number of values as a result of an exclusive-or (XOR) operation performed on two consecutive bit groups of the generator matrix.

7. The apparatus of claim 6, wherein each of the bit groups of the generator matrix corresponds to one of the plurality of data bits, wherein each of the bit groups comprises a plurality of positions, each position comprising either a first value or a second value.

8. The apparatus of claim 7, wherein each of the bit groups comprises an odd number of second values, the odd number being greater than one.

9. The apparatus of claim 7 further comprising:
means for performing the XOR operation on a first set of two consecutive bit groups of the generator matrix to obtain a first vector; and
means for performing the XOR operation on a second set of two consecutive bit groups of the generator matrix to obtain a second vector that is different than the first vector.

10. The apparatus of claim 7 further comprising means for performing the XOR operation on any two consecutive bit groups of the generator matrix to obtain a first vector that includes a predefined number of values.

11. The apparatus of claim 10, further comprising means for performing the XOR operation on any two non-consecutive bit groups of the generator matrix to obtain a second vector that comprises a number of values that is different than the predefined number of values.

12. The apparatus of claim 7, wherein the means for correcting two consecutive data bits of the set of data comprises means for determining that the two consecutive data bits of the set of data both comprise an error when the comparison result corresponds to an entry in a correlation table that is associated with the two consecutive data bits of the set of data.

13. A system comprising:
a memory device; and
a processor coupled to the memory device, wherein the processor comprises:
a data storage structure to store data and a first error correction code that corresponds to the data, wherein the first error correction code was generated using a generator matrix having a plurality of bit groups, each of the plurality of bit groups comprising a unique combination of bit values;
circuitry coupled to the data storage structure, the circuitry to:
compare the first error correction code and a second error correction code to obtain a comparison result, wherein the second error correction code is generated based on the generator matrix, wherein there are no errors in the data when the comparison result is equal to zero, wherein there is at least one error in the data when the comparison result is not equal to zero;
correct a single bit error of the data when the comparison result matches one of the unique combination of bit values of one of the plurality of bit groups in the generator matrix; and
correct two consecutive data bits of the data when the comparison result corresponds to a predefined number of values as a result of an exclusive-or (XOR) operation performed on two consecutive bit groups of the generator matrix.

14. The system of claim 13, wherein the circuitry comprises:
an error correction code generator to generate the second error correction code based on the generator matrix;
a comparator; and
a data corrector.

15. The system of claim 14, wherein the data corrector comprises error detection logic to determine that the two consecutive data bits of the data both comprise an error when the comparison result corresponds to an entry in a correlation table that is associated with the two consecutive data bits of the data.

16. The system of claim 13, wherein each of the plurality of bit groups of the generator matrix corresponds to one of a plurality of data bits of the data, wherein each of the plurality of bit groups comprises a plurality of positions, each position comprising either a first value or a second value.

17. The system of claim 13, wherein each of the plurality of bit groups comprises an odd number of second values, the odd number being greater than one.

18. The system of claim 13, wherein the XOR operation performed on a first set of two consecutive bit groups of the plurality of bit groups results in a first vector, and wherein the XOR operation performed on a second set of two consecutive bit groups of the plurality of bit groups results in a second vector that is different than the first vector.

19. The system of claim 13, wherein the XOR operation performed on any two consecutive bit groups of the plurality of bit groups results in a first vector that includes a same number of values.

20. The system of claim 19, wherein the XOR operation performed on any two non-consecutive bit groups of the plurality of bit groups results in a second vector that comprises a number of values that is different than the same number of values.

\* \* \* \* \*